United States Patent
Hatsumi et al.

(10) Patent No.: US 10,416,504 B2
(45) Date of Patent: Sep. 17, 2019

(54) LIQUID CRYSTAL DISPLAY DEVICE

(71) Applicant: SEMICONDUCTOR ENERGY LABORATORY CO., LTD., Atsugi-shi, Kanagawa-ken (JP)

(72) Inventors: Ryo Hatsumi, Kanagawa (JP); Shuji Fukai, Kanagawa (JP); Daisuke Kubota, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 192 days.

(21) Appl. No.: 14/278,664

(22) Filed: May 15, 2014

(65) Prior Publication Data

US 2014/0347588 A1    Nov. 27, 2014

(30) Foreign Application Priority Data

May 21, 2013  (JP) .................. 2013-106681
Jun. 17, 2013  (JP) .................. 2013-126895
Jul. 24, 2013  (JP) .................. 2013-153362

(51) Int. Cl.
  *G02F 1/1343* (2006.01)
  *G02F 1/137* (2006.01)
  *H01L 27/12* (2006.01)

(52) U.S. Cl.
  CPC .......... *G02F 1/134363* (2013.01); *G02F 2001/13712* (2013.01); *G02F 2001/134372* (2013.01);
  (Continued)

(58) Field of Classification Search
  CPC ........ G02F 2001/134381; G02F 2001/134372; G02F 1/134363; H01L 27/1225
  See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Hatsumi et al., "Driving Method of FFS-Mode OS-LCD for Reducing Eye Strain", Sid Digest '13 : Sid International Symposium Digest of Technical Papers, May 21, 2013, pp. 338-341.
(Continued)

*Primary Examiner* — Paisley L Arendt
(74) *Attorney, Agent, or Firm* — Nixon Peabody LLP; Jeffrey L. Costellia

(57) ABSTRACT

The liquid crystal display device includes a first substrate, a second substrate, and a liquid crystal layer between the first substrate and the second substrate. The first substrate includes a transistor including an oxide semiconductor film including a channel formation region; a pixel electrode electrically connected to the transistor; an insulating layer in contact with the pixel electrode; and a first common electrode in contact with the insulating layer. The second substrate faces the first substrate and includes a second common electrode. A negative liquid crystal material is used for the liquid crystal layer. The specific resistivity of the liquid crystal material is greater than or equal to $1.0 \times 10^{13}$ $\Omega \cdot cm$ and less than or equal to $1.0 \times 10^{16}$ $\Omega \cdot cm$.

18 Claims, 23 Drawing Sheets

(52) U.S. Cl.
CPC .............. *G02F 2001/134381* (2013.01); *H01L 27/1225* (2013.01)

(56) References Cited

U.S. PATENT DOCUMENTS

| | | |
|---|---|---|
| 6,294,274 B1 | 9/2001 | Kawazoe et al. |
| 6,469,765 B1 | 10/2002 | Matsuyama et al. |
| 6,563,174 B2 | 5/2003 | Kawasaki et al. |
| 6,642,985 B2 | 11/2003 | Kim et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,995,181 B2 | 8/2011 | Choi et al. |
| 8,058,645 B2 | 11/2011 | Jeong et al. |
| 8,164,697 B2 * | 4/2012 | Iwamoto ............ G02F 1/133723 349/178 |
| 8,202,365 B2 | 6/2012 | Umeda et al. |
| 8,482,005 B2 | 7/2013 | Yamazaki et al. |
| 8,987,728 B2 | 3/2015 | Honda et al. |
| 9,490,351 B2 | 11/2016 | Honda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/1003844 | 2/2004 | Takedak et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0260359 A1 * | 11/2005 | Kunimatsu .......... C09K 19/584 428/1.4 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279359 A1 | 12/2007 | Yoshida et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149138 A1 | 6/2010 | Lee et al. |
| 2010/0165255 A1 | 7/2010 | Ishitani et al. |
| 2010/0182273 A1 | 7/2010 | Noguchi et al. |
| 2010/0194450 A1 | 8/2010 | Shimizu et al. |
| 2010/0230680 A1 | 9/2010 | Seong et al. |
| 2010/0320458 A1 | 12/2010 | Umeda et al. |
| 2010/0320459 A1 | 12/2010 | Umeda et al. |
| 2011/0051064 A1 * | 3/2011 | Matsumori ....... G02F 1/133711 349/123 |
| 2011/0076790 A1 | 3/2011 | Ofuji et al. |
| 2011/0090416 A1 | 4/2011 | Arasawa et al. |
| 2011/0115997 A1 * | 5/2011 | Kim ................... G02F 1/13439 349/37 |
| 2011/0134345 A1 | 6/2011 | Yamazaki et al. |
| 2011/0175081 A1 | 7/2011 | Goyal et al. |
| 2012/0049889 A1 * | 3/2012 | Hatano ............... H01L 27/1156 326/102 |
| 2012/0075238 A1 | 3/2012 | Minami et al. |
| 2012/0119205 A1 | 5/2012 | Taniguchi et al. |
| 2013/0077038 A1 * | 3/2013 | Rho ...................... B82Y 20/00 349/144 |
| 2014/0016056 A1 | 1/2014 | Miyake et al. |
| 2014/0070211 A1 | 3/2014 | Iwasaki et al. |
| 2014/0104507 A1 | 4/2014 | Yamazaki et al. |
| 2014/0104508 A1 | 4/2014 | Yamazaki et al. |
| 2014/0104524 A1 * | 4/2014 | Lee ........................ G09G 3/36 349/41 |
| 2014/0111561 A1 | 4/2014 | Iyama et al. |
| 2014/0175436 A1 | 6/2014 | Yamazaki |
| 2014/0377893 A1 | 12/2014 | Ishitani et al. |
| 2015/0179803 A1 | 6/2015 | Yamazaki et al. |

FOREIGN PATENT DOCUMENTS

| | | |
|---|---|---|
| EP | 2503597 A | 9/2012 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-356786 A | 12/2000 |
| JP | 2002-031812 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-523850 A | 10/2006 |
| JP | 2009-075179 A | 4/2009 |
| JP | 2009-134228 A | 6/2009 |
| JP | 2010-170119 A | 8/2010 |
| JP | 2012-059860 | 3/2012 |
| JP | 2012-216797 A | 11/2012 |
| WO | WO-2004/114391 | 12/2004 |
| WO | WO 2013-001979 A1 | 1/2013 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and SC2O3—A2O3—Bo Systems [A; Fe, Ga, or Al; B: Mg, Mn, Fe, Ni, Cu, or Zn] at Temperatures Over 1000° C.", Journal of Solid State Chemistry, 1985; vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li. C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn, J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature. Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B.(Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4,0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515, Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown Zno TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

316

320  318

364

322

LIQUID CRYSTAL DISPLAY DEVICE

BACKGROUND OF THE INVENTION

1. Field of the Invention

The present invention relates to, for example, a semiconductor device, a display device, a light-emitting device, a driving method thereof, or a manufacturing method thereof. In particular, the present invention relates to, for example, an active matrix liquid crystal display device.

2. Description of the Related Art

With the recent rapid spread of portable information terminals such as smartphones, improvement in their performance has progressed rapidly. Their screens have been increased in size and resolution. In addition to improvement in the resolution of a screen, emphasis has been put on power consumption of a display device. A typical example of the display device is a liquid crystal display device using liquid crystal elements.

Examples of display modes for the liquid crystal display device include a vertical alignment (VA) mode in which liquid crystal molecules with negative dielectric constant anisotropy are aligned vertical to a substrate surface; an in-plane switching (IPS) mode and a fringe field switching (FFS) mode in which liquid crystal molecules with positive or negative dielectric constant anisotropy are aligned horizontal to a substrate surface and a horizontal electric field is applied to a liquid crystal layer.

For example, as an FFS-mode liquid crystal display device, a display device having high-speed response and wide viewing angle is disclosed (see Patent Document 1). The display device includes a first substrate with a first common electrode layer; liquid crystal between the first substrate and a second substrate; and a means for generating an electric field between the first common electrode layer on the first substrate and both a pixel electrode layer and a second common electrode layer on the second substrate so that the display device provides high-speed responses to high input data rates and allows for wide viewing angles for viewers.

Furthermore, as an FFS-mode liquid crystal display device, a liquid crystal display device capable of high-speed response by driving liquid crystal with two pairs of electrodes is disclosed (see Patent Document 2).

REFERENCE

Patent Document

[Patent Document 1] Japanese Translation of PCT International Application No. 2006-523850
[Patent Document 2] International Publication WO 2013/001979

SUMMARY OF THE INVENTION

For wide viewing angle and high-speed response, the liquid crystal drive device disclosed in Patent Document 1 uses three electrodes to control liquid crystal molecules. However, even when high-speed response can be achieved, the three electrodes need to be driven separately, which increases the power consumption of the display device.

In the liquid crystal drive device disclosed in Patent Document 2, two pairs of electrodes, that is, four electrodes are used to drive liquid crystal and at least four power supply lines are needed; thus, there is a problem in that the number of power supply lines is increased. The increase in the number of power supply lines complicates a method for driving or controlling voltage applied to the liquid crystal and increases power consumption.

In view of the above technical background, an object of one embodiment of the present invention is to provide a liquid crystal display device with low power consumption. Another object of one embodiment of the present invention is to provide a liquid crystal display device in which change in transmittance is reduced. Another object of one embodiment of the present invention is to provide a liquid crystal display device in which change in display luminance is reduced. Another object of one embodiment of the present invention is to provide a liquid crystal display device in which flickers of display are reduced. Another object of one embodiment of the present invention is to provide a liquid crystal display device capable of eye-friendly display. Another object of one embodiment of the present invention is to provide a liquid crystal display device that causes less eye fatigue.

Note that the description of these objects does not disturb the existence of other objects. In one embodiment of the present invention, there is no need to achieve all the objects. Other objects will be apparent from and can be derived from the description of the specification, the drawings, the claims, and the like.

In a liquid crystal display device of one embodiment of the present invention, an insulated-gate field-effect transistor (hereinafter, simply referred to as a transistor) with extremely low off-state current is provided in a pixel in order to keep display of images on a pixel portion after the writing of image signals to the pixel portion is stopped. By using the above transistor as an element for controlling the supply of voltage to a liquid crystal element included in the pixel, the voltage applied to the liquid crystal element can be held for a long time. Thus, for example, in the case where image signals having the same image data are repeatedly written to the pixel portion during continuous frame periods as in the case of displaying a still image, the displayed image can be maintained even when the driving frequency is lowered by temporarily stopping the writing of image signals to the pixel portion, that is, even when the number of times of writing of image signals in a certain period is reduced.

In the liquid crystal display device of one embodiment of the present invention, a liquid crystal element includes a liquid crystal layer to which an electric field is applied by three electrodes (a pixel electrode, a first common electrode, and a second common electrode). A negative liquid crystal material is used for the liquid crystal layer. The specific resistivity of the liquid crystal material is greater than or equal to $1.0\times10^{13}$ $\Omega\cdot cm$ and less than or equal to $1.0\times10^{16}$ $\Omega\cdot cm$. With this structure, the liquid crystal display device causes less change in transmittance and few image flickers perceivable by users even when the number of image signal writing operations in a certain period is reduced.

One embodiment of the present invention can provide a liquid crystal display device with low power consumption. Another embodiment of the present invention can provide a liquid crystal display device with less change in transmittance.

DETAILED DESCRIPTION OF THE INVENTION

Hereinafter, embodiments of the present invention will be described in detail with reference to the accompanying drawings. Note that the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that in this specification, a panel in which liquid crystal elements are formed in respective pixels, and a module in which an IC or the like including a driver circuit or a controller is mounted on the panel fall into the category of a liquid crystal display device. Further, an element substrate corresponding to one mode before a liquid crystal element is completed in a manufacturing process of a liquid crystal display device falls into the category of the liquid crystal display device of one embodiment of the present invention.

In addition, the liquid crystal display device of one embodiment of the present invention may include a touch panel which is a position input device capable of detecting a position pointed at with a finger, a stylus, or the like and generating a signal including the positional information.

Embodiment 1

In this embodiment, a configuration example of a pixel in a liquid crystal display device of one embodiment of the present invention is described with reference to FIGS. 1A and 1B.

<Configuration Example of Pixel>

Figure 1A:
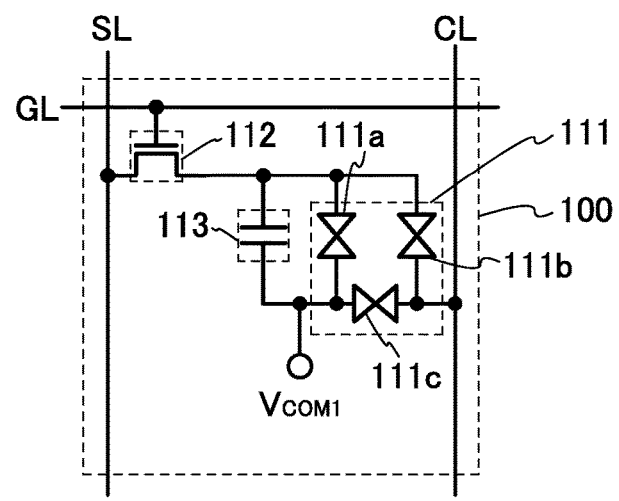
FIGS. 1A and 1B are a circuit diagram and a cross-sectional view illustrating a configuration of a pixel in a liquid crystal display device of one embodiment of the present invention.

FIG. 1A illustrates a configuration example of a pixel included in the liquid crystal display device of one embodiment of the present invention. A pixel 100 illustrated in FIG. 1A includes a liquid crystal element 111, a transistor 112 controlling the supply of an image signal to the liquid crystal element 111, and a capacitor 113.

The liquid crystal element 111 includes a pixel electrode, a first common electrode, a second common electrode, and a liquid crystal layer which contains a liquid crystal material and to which a voltage is applied across the pixel electrode, the first common electrode, and the second common electrode.

In the liquid crystal element 111 illustrated in FIG. 1A, a region where voltage is applied between the pixel electrode and the first common electrode is denoted by a liquid crystal element 111a, a region where voltage is applied between the pixel electrode and the second common electrode is denoted by a liquid crystal element 111b, and a region where voltage is applied between the first common electrode and the second common electrode is denoted by a liquid crystal element 111c.

FIG. 1A illustrates a fringe field switching (FFS) mode liquid crystal element 111, in which case the pixel electrode and the first common electrode partly overlap with each other with an insulating film interposed therebetween. This overlapping area serves as a capacitor for holding a voltage $V_{LC}$ applied between the pixel electrode and the first common electrode. Such a capacitor is denoted as a capacitor 113 in FIG. 1A.

The transistor 112 controls whether the potential of an image signal input to a wiring SL is applied to the pixel electrode of the liquid crystal element 111. A predetermined reference potential $V_{COM1}$ is applied to the first common electrode of the liquid crystal element 111.

Hereinafter, the connection relationship among the liquid crystal element 111, the transistor 112, and the capacitor 113 will be described in detail.

Note that in this specification, the term "connection" means electrical connection and corresponds to a state in which a current, a voltage, or a potential can be supplied or transmitted. Therefore, a state of being "connected" means not only a state of direct connection but also a state of indirect connection through a circuit element such as a wiring, a resistor, a diode, or a transistor so that a current, a voltage, or a potential can be supplied or transmitted.

In addition, even when different components are connected to each other in a circuit diagram, there is actually a case where one conductive film has functions of a plurality of components, for example, a case where part of a wiring serves as an electrode. In this specification, the term "connection" also means such a case where one conductive film has functions of a plurality of components.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of the transistor is described in some cases assuming that the source and the drain are fixed for convenience; actually, the names of the source and the drain interchange with each other depending on the relation of the potentials.

A source of a transistor means a source region that is part of a semiconductor film functioning as an active layer or a source electrode that is connected to the semiconductor film. Similarly, a drain of a transistor means a drain region that is part of the semiconductor film or a drain electrode that is connected to the semiconductor film. A gate means a gate electrode.

In the pixel 100 illustrated in FIG. 1A, a gate of the transistor 112 is electrically connected to a wiring GL. One of a source and a drain of the transistor 112 is connected to the wiring SL, and the other of the source and the drain of the transistor 112 is connected to the pixel electrode of the liquid crystal element 111. The capacitor 113 includes a pair of electrodes: one electrode is electrically connected to the pixel electrode of the liquid crystal element 111, and a predetermined potential $V_{COM1}$ is applied to the other electrode. In the pixel 100 illustrated in FIG. 1A, the second common electrode of the liquid crystal element 111 is connected to a wiring CL, and $V_{COM2}$ is applied to the wiring CL.

FIG. 1A shows an example in which one transistor 112 is used as a switch for controlling the input of an image signal to the pixel 100. Alternatively, the pixel 100 may include a plurality of transistors functioning as one switch.

In one embodiment of the present invention, the transistor 112 has an extremely low off-state current, so that the voltage applied to the liquid crystal element 111 can be held for a long time. Thus, for example, in the case where image signals having the same image data are written to the pixel 100 during continuous frame periods as in the case of displaying a still image, the displayed gray scale can be maintained even when the driving frequency is lowered, that is, even when the number of times of writing of image signals to the pixel 100 in a certain period is reduced. For example, by using a highly purified oxide semiconductor for a channel formation region of the transistor 112, the interval between writing operations of image signals can be made longer than or equal to 10 seconds, preferably longer than or equal to 30 seconds, and more preferably longer than or equal to one minute. An increase in the interval between writing operations of image signals results in a reduction in power consumption.

When a semiconductor having a wider bandgap and lower intrinsic carrier density than silicon or germanium, such as an oxide semiconductor, is used for the transistor 112, the withstand voltage of the transistor 112 can be increased and the off-state current can be made extremely low. Thus, as compared to the case where a transistor including a normal semiconductor such as silicon or germanium is used, degradation of the transistor 112 can be prevented and the voltage held in the liquid crystal element 111 can be maintained.

Note that even when a small amount of charge is leaked through the transistor 112, the electric field applied to the liquid crystal layer might vary depending on some factors after the writing of an image signal is completed.

One of the factors in changing the electric field applied to the liquid crystal layer is adsorption of ionic impurities on an alignment film. A liquid crystal material includes ionic impurities, and when the impurities are adsorbed on the alignment film, an electric field called residual DC is generated in some cases. The residual DC caused by the adsorption of the impurities changes the electric field applied to the liquid crystal layer, thereby changing the transmittance of the liquid crystal element 111. The residual DC increases when a direct-current voltage is applied to the liquid crystal element for a longer time. Hence, in the case of the driving method with a long interval between writing operations of image signals as in one embodiment of the present invention, the transmittance is more likely to vary than that in the case of a normal driving method with a frame frequency of about 60 Hz.

Another factor in changing the electric field applied to the liquid crystal layer is a leakage current through the liquid crystal element 111. When a voltage is applied to the liquid crystal element 111, a small amount of leakage current flows between the pixel electrode and the first common electrode or between the pixel electrode and the second common electrode through the liquid crystal layer; accordingly, the absolute value of a voltage applied to the liquid crystal element 111 decreases over time. Hence, in the case of the driving method with a long interval between writing operations of image signals as in one embodiment of the present invention, for example, the transmittance is more likely to vary than that in the case of a normal driving method with a frame frequency of about 60 Hz.

However, in the liquid crystal display device of one embodiment of the present invention, a negative liquid crystal material is used for the liquid crystal layer of the liquid crystal element 111, and the specific resistivity of the liquid crystal material is greater than or equal to $1.0 \times 10^{13}$ Ω·cm and less than or equal to $1.0 \times 10^{16}$ Ω·cm, preferably greater than or equal to $1.0 \times 10^{14}$ Ω·cm and less than or equal to $1.0 \times 10^{16}$ Ω·cm. Note that the specific resistivity of the liquid crystal material in this specification and the like is measured at 20° C.

A negative liquid crystal material is used for the liquid crystal layer in the liquid crystal element 111, so that change in the transmittance of the liquid crystal element 111 can be reduced. Furthermore, the specific resistivity of the liquid crystal material is set within the above range, so that leakage current flowing through the liquid crystal element 111 can be reduced.

The transmittance of the liquid crystal element 111 varies depending on the polarity (the positive (+) or negative (−)

polarity) applied to the liquid crystal layer. For example, a difference in transmittances due to different polarities in the case of using a positive liquid crystal material for the material of the liquid crystal layer in the liquid crystal element 111 might be different from a difference in transmittances due to different polarities in the case of using a negative liquid crystal material. Here, the difference in transmittances depending on the polarity is described with reference to FIGS. 2A and 2B. Note that the positive liquid crystal material is a liquid crystal material with a positive dielectric anisotropy and the negative liquid crystal material is a liquid crystal material with a negative dielectric anisotropy.

Figure 2A:
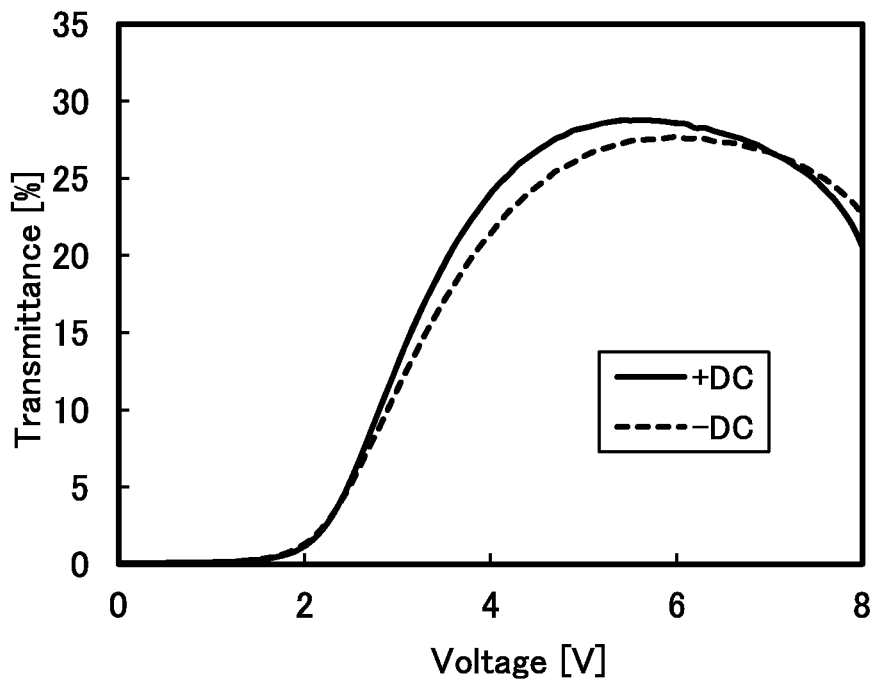
FIG. 2A is a graph showing transmittances with different polarities in the case of using a positive liquid crystal material and FIG. 2B is a graph showing transmittances with different polarities in the case of using a negative liquid crystal material.
Figure 2B:
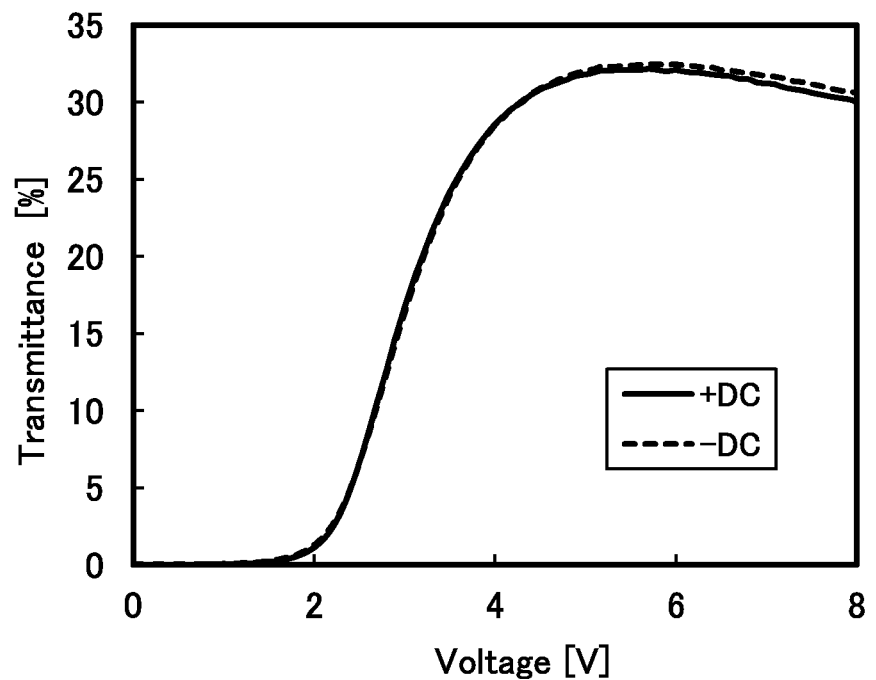

FIG. 2A shows transmittance-voltage characteristics in the case of using a positive liquid crystal material (MLC-7030 produced by Merck) and FIG. 2B shows transmittance-voltage characteristics in the case of using a negative liquid crystal material (MLC-3006 produced by Merck). As to the physical properties of the positive liquid crystal material shown in FIG. 2A, the dielectric constant anisotropy $\Delta\varepsilon$ is 3.8 and the resistivity $\rho$ is $4.9\times10^{14}$ $\Omega\cdot$cm. As to the physical properties of the negative liquid crystal material shown in FIG. 2B, the dielectric constant anisotropy $\Delta\varepsilon$ is $-3.0$ and the resistivity $\rho$ is $1.8\times10^{13}$ $\Omega\cdot$cm. Note that in FIGS. 2A and 2B, the horizontal axis represents voltage (V); the vertical axis represents transmittance (%); the solid line represents transmittance in the case where the positive (+) polarity is applied; and the dashed line represents transmittance in the case where the negative (−) polarity is applied.

FIGS. 2A and 2B indicate that a difference in transmittances depending on the polarity applied to the liquid crystal layer is small in the case of using the negative liquid crystal material. This is probably caused by a flexo-electric effect. The flexo-electric effect is a phenomenon in that spontaneous polarization is induced by deformation. The flexo-electric effect mainly depends on the shape of a molecule.

For example, a nematic liquid crystal exhibits spontaneous polarization under splay or bend deformation. To liquid crystal molecules themselves, the polarity of an applied voltage does not essentially make a difference, but spontaneous polarization tends to exhibit opposite behaviors based on the polarities of an electric field. This probably produces a difference in transmittances depending on the polarity. The flexo-electric polarization P that is caused by the flexo-electric effect is expressed by Formula (I) below.

$$\vec{P} = e_{splay}(\vec{n}\Lambda\cdot\vec{n}) + e_{bend}(\vec{n}\times\Lambda\times\vec{n}) \quad (1)$$

Here, e represents the flexoelectric coefficient mainly based on molecular shape, and n represents the liquid crystal director. The polarization is expressed as a product of the flexoelectric coefficient and the deformation.

Accordingly, to prevent occurrence of polarization and reduce flickers, it is preferable that the flexo-coefficient or the distortion of orientation be small.

The results of FIGS. 2A and 2B indicate that the distortion of orientation caused by the flexo-electric effect can be made small with the use of a negative liquid crystal material.

In the liquid crystal display device of one embodiment of the present invention, driving of the liquid crystal element 111 is controlled by the pixel electrode, the first common electrode, and the second common electrode. A method for driving the liquid crystal element 111 is described below with reference to FIG. 1B.

Figure 1B:
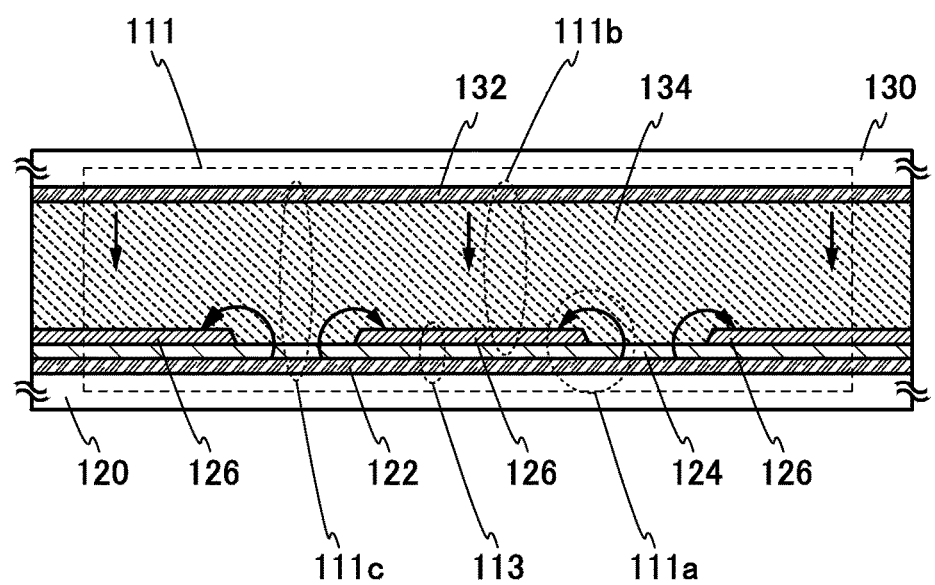

FIG. 1B is a cross-sectional view illustrating an example of the liquid crystal element 111 in the liquid crystal display device of one embodiment of the present invention.

The liquid crystal element 111 includes a first common electrode 122 over a substrate 120; an insulating layer 124 over the first common electrode 122; a pixel electrode 126 over the insulating layer 124; a liquid crystal layer 134 over the insulating layer 124 and the pixel electrode 126; a second common electrode 132 over the liquid crystal layer 134; and a substrate 130 over the second common electrode 132. As in FIG. 1B, the pixel electrode 126 is in contact with the insulating layer 124, and the insulating layer 124 is in contact with the first common electrode 122. Note that the first common electrode 122, the insulating layer 124, and the pixel electrode 126 are formed over the substrate 120, and the second common electrode 132 is formed under the substrate 130. That is, the liquid crystal layer 134 is sandwiched between the substrate 120 and the substrate 130. In FIG. 1B, plural pixel electrodes 126 are illustrated because openings (slits) are formed over the insulating layer 124.

In the cross-sectional view of FIG. 1B, the liquid crystal element 111a includes the first common electrode 122, the pixel electrode 126, and the liquid crystal layer 134. By application of voltage between the first common electrode 122 and the pixel electrode 126, orientation of the liquid crystal layer 134 in the liquid crystal element 111a can be controlled. The liquid crystal element 111b includes the second common electrode 132, the pixel electrode 126, and the liquid crystal layer 134. By application of voltage between the second common electrode 132 and the pixel electrode 126, orientation of the liquid crystal layer 134 in the liquid crystal element 111b can be controlled. Furthermore, orientation of the liquid crystal layer 134 in the liquid crystal element 111c can be controlled by application of voltage between the first common electrode 122 and the second common electrode 132. The capacitor 113 illustrated in FIG. 1A includes the first common electrode 122, the insulating layer 124, and the pixel electrode 126. The insulating layer 124 serves as a dielectric layer of the capacitor 113.

In the cross-sectional view of FIG. 1B, voltage applied to the liquid crystal layer 134 is schematically shown by arrows.

For example, 5.5 V is applied to the pixel electrode 126; 0 V, the first common electrode 122; and 0.8 V, the second common electrode 132, so that the liquid crystal element 111 illustrated in FIG. 1B can be driven. In this case, a potential difference between the first common electrode 122 and the second common electrode 132 is 0.8 V; thus, an influence of an electric field of the liquid crystal element 111c illustrated in FIG. 1B is small. In contrast, a potential difference between the first common electrode 122 and the pixel electrode 126 is 5.5 V, and a potential difference between the pixel electrode 126 and the second common electrode 132 is 4.7 V. Thus, the orientation of liquid crystal in the liquid crystal layer 134 is controlled by the potential difference between the first common electrode 122 and the pixel electrode 126. Furthermore, the potential applied to the second common electrode 132 can assist the first common electrode 122 and the pixel electrode 126 to control the orientation of the liquid crystal element 111. Therefore, it is preferable that the first common electrode 122 and the second common electrode 132 be connected to different power supply lines so as to control potentials independently.

Thus, the potential difference between the first common electrode 122 and the second common electrode 132 is smaller than the potential difference between the first common electrode 122 and the pixel electrode 126, whereby change in the transmittance of the liquid crystal layer 134 can be made small.

It is preferable that a negative liquid crystal material with a resistivity of greater than or equal to $1.0 \times 10^{13}$ Ω·cm and less than or equal to $1.0 \times 10^{16}$ Ω·cm be used for the liquid crystal layer 134 of the liquid crystal element 111.

As described above, the liquid crystal layer 134 is controlled by three electrodes (the first common electrode 122, the pixel electrode 126, and the second common electrode 132), and a negative liquid crystal material is used for the liquid crystal layer 134, so that change in the transmittance of the liquid crystal layer 134 can be made small and thus, occurrence of perceivable flickers can be prevented. This is an excellent effect that can be achieved only by one embodiment of the present invention.

Moreover, in the liquid crystal display device of one embodiment of the present invention, the voltage $V_{LC1}$ of the liquid crystal element 111 can be held by the capacitor 113, which results in a reduction in the area of the capacitor 113. In other words, the perception of flicker can be prevented while the area of the capacitor 113 is reduced. Accordingly, high-definition pixels are achieved and the interval between writing operations of image signals can be increased; it is thus possible to provide an eye-friendly liquid crystal display device that gives less eye fatigue to a user.

<Configuration Example of Panel>

Next, description will be made on a configuration example of a panel which corresponds to one embodiment of the liquid crystal display device.

Figure 3:
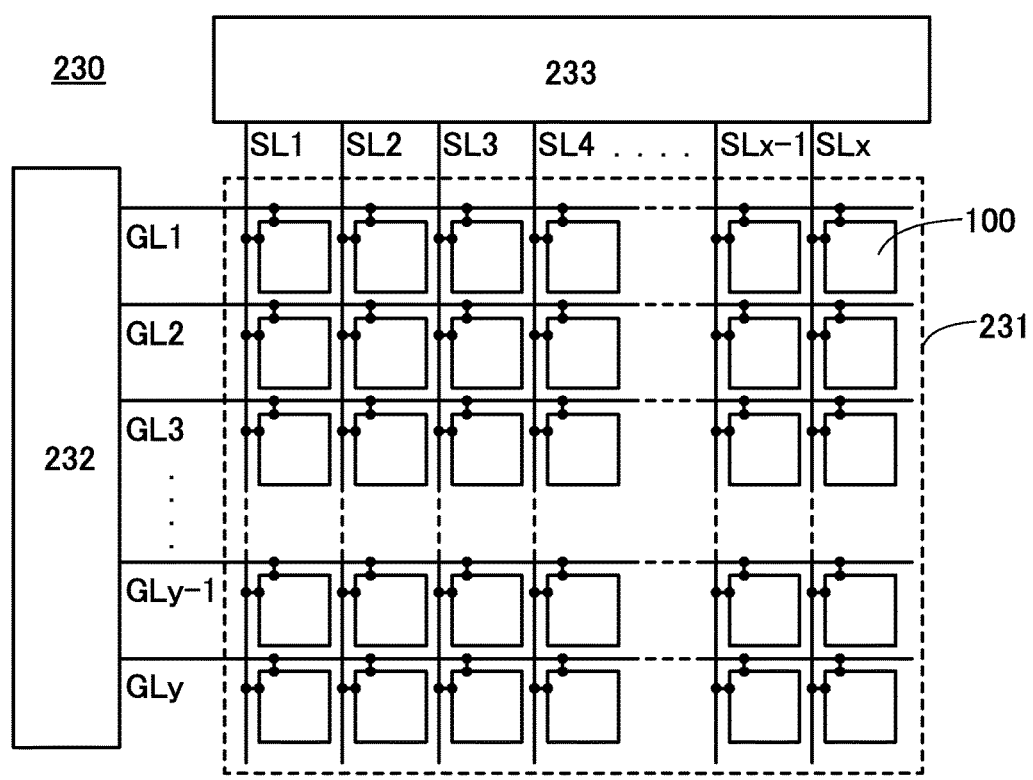
FIG. 3 is a block diagram illustrating a configuration example of a panel of a liquid crystal display device of one embodiment of the present invention.

In a panel 230 illustrated in FIG. 3, a pixel portion 231 includes a plurality of pixels 100, wirings GL (wirings GL1 to GLy, y: a natural number) for selecting the pixels 100 in each row, and wirings SL (wirings SL1 to SLx, x: a natural number) for supplying image signals to the selected pixels 100. A driver circuit 232 controls the input of signals to the wirings GL, and a driver circuit 233 controls the input of image signals to the wirings SL. Each of the plurality of pixels 100 is connected to at least one of the wirings GL and at least one of the wirings SL.

Note that the kinds and number of the wirings in the pixel portion 231 can be determined by the structure, number, and arrangement of the pixels 100. Specifically, in the pixel portion 231 illustrated in FIG. 3, the pixels 100 are arranged in a matrix of x columns and y rows, and the wirings SL1 to SLx and the wirings GL1 to GLy are provided in the pixel portion 231.

In one embodiment of the present invention, since the driver circuit 232 and the driver circuit 233 are operated intermittently, the number of times of writing image signals to the pixel portion 231 can be greatly reduced while the image is continuously displayed. For example, by using a highly purified oxide semiconductor for a channel formation region of the transistor 112, the length of a frame period can be made longer than or equal to 10 seconds, preferably longer than or equal to 30 seconds, and more preferably longer than or equal to one minute. Accordingly, the drive frequency of the driver circuit 232 and the driver circuit 233 can be significantly reduced, leading to a reduction in the power consumption of the liquid crystal display device.

Note that in one embodiment of the present invention, it is possible to employ dot sequential driving in which image signals are sequentially input from the driver circuit 233 to the wirings SL1 to SLx, or line sequential driving in which image signals are concurrently input from the driver circuit 233 to the wirings SL1 to SLx. Alternatively, the liquid crystal display device of one embodiment of the present invention may employ a driving method in which image signals are sequentially input to every plural wirings SL.

The selection of the wirings GL may be performed by either progressive scan or interlaced scan.

Note that the response time of a liquid crystal from application of voltage to saturation of the change in transmittance is generally about ten milliseconds. Thus, the slow response of the liquid crystal tends to be perceived as a blur of a moving image. As a countermeasure, one embodiment of the present invention may employ overdriving in which a voltage applied to the liquid crystal element 111 is temporarily increased so that alignment of the liquid crystal is changed quickly. By overdriving, the response speed of the liquid crystal can be increased, a blur of a moving image can be prevented, and the quality of the moving image can be improved.

Further, if the transmittance of the liquid crystal element 111 keeps changing without reaching a constant value after the transistor 112 is turned off, the relative dielectric constant of the liquid crystal also changes; accordingly, the voltage held in the liquid crystal element 111 easily changes. In particular, in the case where the capacitor 113 connected to the liquid crystal element 111 has small capacitance as in one embodiment of the present invention, the change in the voltage held in the liquid crystal element 111 tends to occur remarkably. However, by the overdriving, the response time can be shortened and therefore the change in the transmittance of the liquid crystal element 111 after the transistor 112 is turned off can be made small. Hence, even in the case where the capacitor 113 connected in parallel to the liquid crystal element 111 has small capacitance, it is possible to prevent the change in the voltage held in the liquid crystal element 111 after the transistor 112 is turned off.

Since a negative liquid crystal material with a resistivity of greater than or equal to $1.0 \times 10^{13}$ Ω·cm and less than or equal to $1.0 \times 10^{16}$ Ω·cm is used for the liquid crystal element 111, voltage held in the liquid crystal element 111 can be prevented from varing after the transistor 112 is turned off.

<Configuration Example of Structure of Liquid Crystal Display Device>

Next, description will be made on a configuration example of the liquid crystal display device of one embodiment of the present invention.

Figure 4:
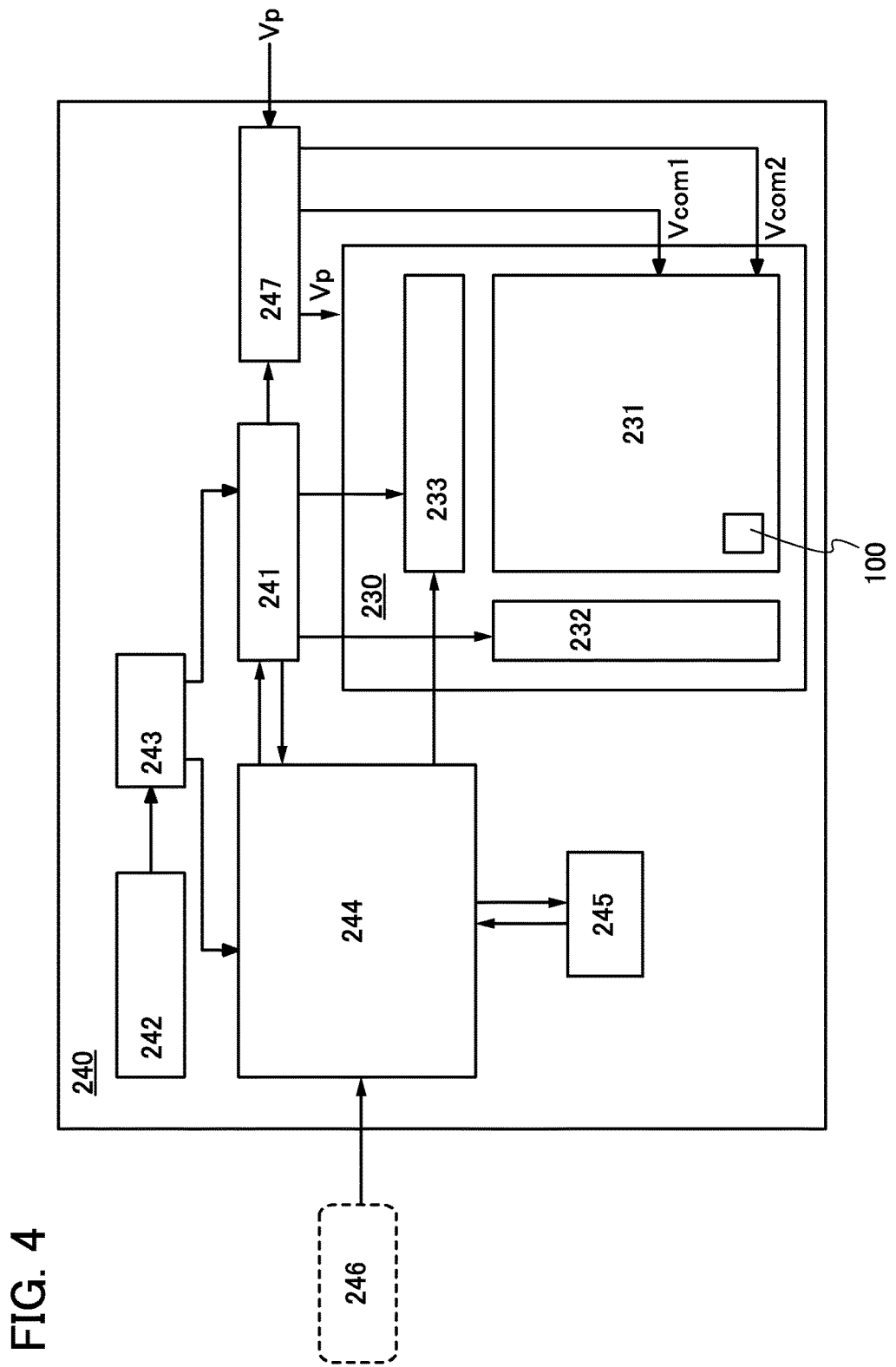
FIG. 4 is a block diagram illustrating a structure of a liquid crystal display device of one embodiment of the present invention.

FIG. 4 is a block diagram illustrating an example of the structure of the liquid crystal display device of one embodiment of the present invention. A liquid crystal display device 240 illustrated in FIG. 4 includes the panel 230 provided with the plurality of pixels 100 in the pixel portion 231, a controller 241, and a power source circuit 247. The liquid crystal display device 240 illustrated in FIG. 4 also includes an input device 242, a CPU 243, an image processing circuit 244, and an image memory 245. Also in the liquid crystal display device 240 illustrated in FIG. 4, the driver circuit 232 and the driver circuit 233 are provided in the panel 230.

Note that the controller 241 has a function of supplying the panel 230 with various driving signals for controlling the operation of the driver circuit 232, the driver circuit 233, or the like. Examples of the driving signals include a start pulse signal for controlling the operation of the driver circuit 233, a clock signal for the driver circuit 233, a start pulse signal for controlling the operation of the driver circuit 232, and a clock signal for the driver circuit 232.

The input device 242 has a function of applying data or an instruction to the CPU 243 included in the liquid crystal display device 240. For example, an instruction to transfer the panel 230 from an operation state to a non-operation state, or an instruction to transfer the pixel portion 231 from a non-operation state to an operation state can be given to the CPU 243 by the input device 242. As the input device 242, a keyboard, a pointing device, a touch panel, or the like can be used.

The CPU 243 has a function of decoding an instruction input from the input device 242 and executing the instruction by totally controlling the operation of various circuits included in the liquid crystal display device 240.

For example, in the case where the instruction to transfer the pixel portion 231 from the operation state to the non-operation state is sent from the input device 242, the CPU 243 gives an instruction to the controller 241 to stop the supply of a power source voltage Vp from the power source circuit 247 to the pixel portion 231, and to stop the supply of a driving signal to the panel 230.

In the case where an instruction to transfer the pixel portion 231 from the non-operation state to the operation state is sent from the input device 242, the CPU 243 gives the instruction to the controller 241 to restart the supply of the power source voltage Vp from the power source circuit 247 to the pixel portion 231, and to restart the supply of the driving signal to the panel 230.

The image memory 245 has a function of storing data 246 which has image data and is input to the liquid crystal display device 240. Note that although just one image memory 245 is provided in the liquid crystal display device 240 in FIG. 4, a plurality of image memories 245 may be provided in the liquid crystal display device 240. For example, in the case where a full-color image is displayed on the pixel portion 231 with the use of three pieces of data 246 corresponding to hues such as red, blue, and green, the image memory 245 corresponding to the data 246 of each hue may be provided.

As the image memory 245, for example, memory circuits such as a dynamic random access memory (DRAM) or a static random access memory (SRAM) can be used. Alternatively, a video RAM (VRAM) may be used as the image memory 245.

The image processing circuit 244 has a function of writing and reading the data 246 to and from the image memory 245 in response to an instruction from the controller 241 and generating an image signal from the data 246.

The power source circuit 247 has a function of supplying the power source voltage Vp to the panel 230 and supplying the potential $V_{COM1}$ and the potential $V_{COM2}$ to the pixel 100.

<Top View of Pixel>

Figure 5:
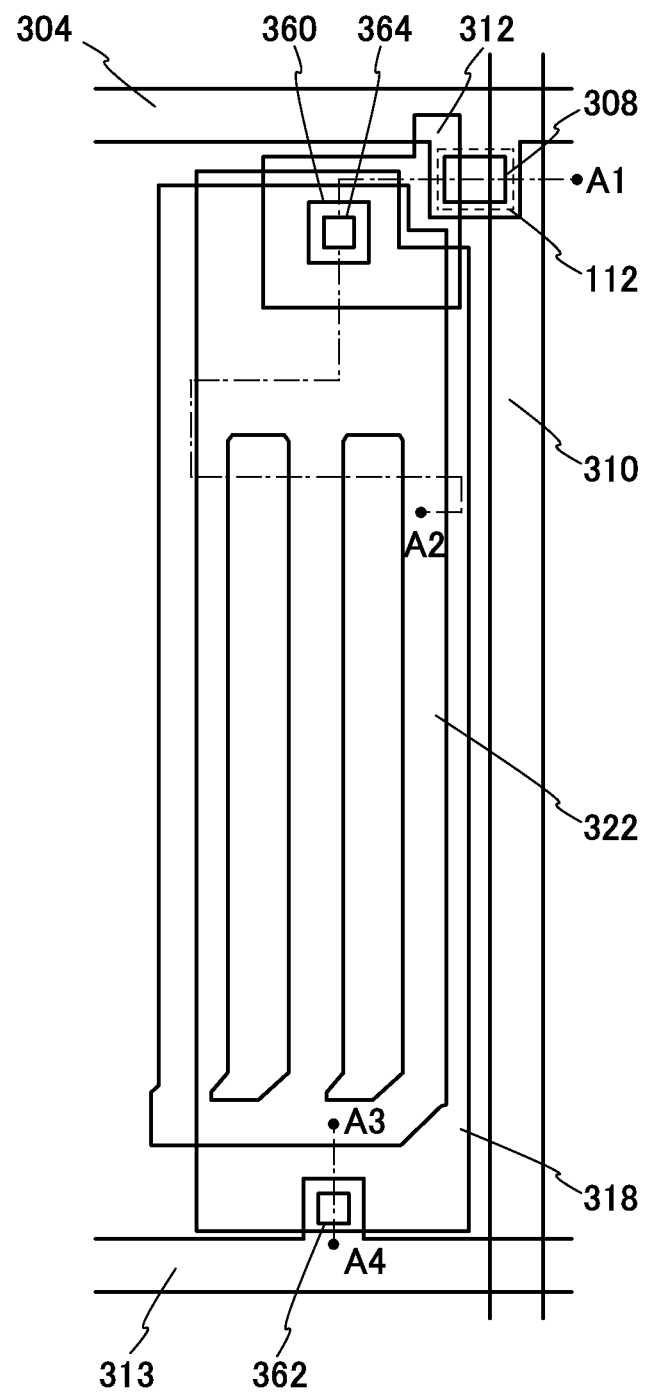
FIG. 5 is a top view illustrating a pixel in a liquid crystal display device of one embodiment of the present invention.
Figure 6:
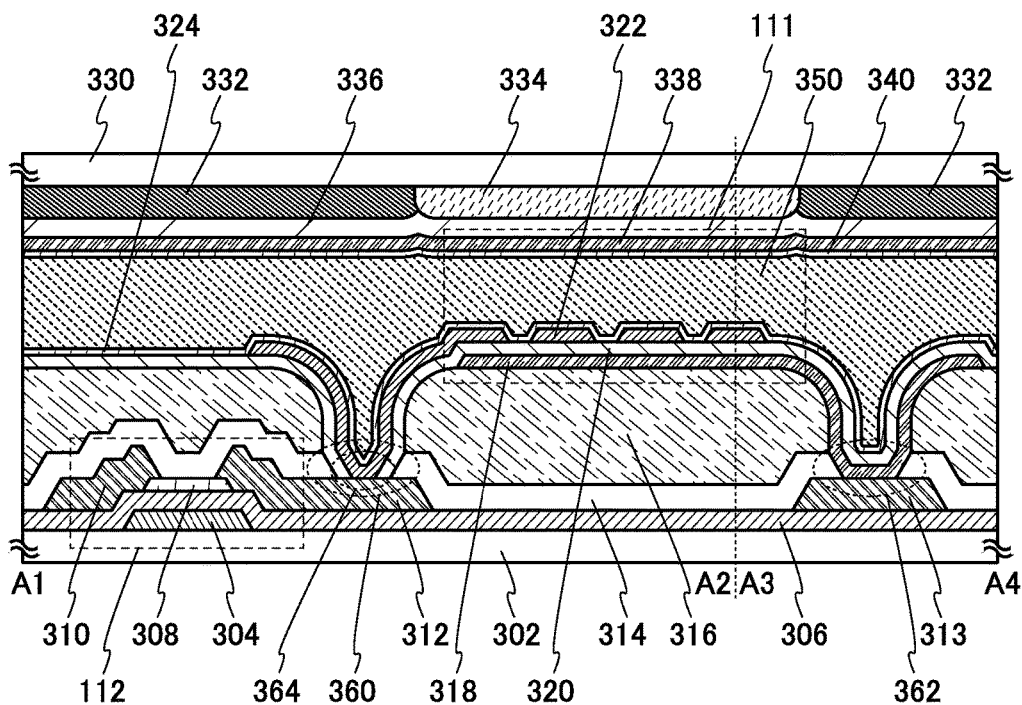
FIG. 6 is a cross-sectional view illustrating a pixel in a liquid crystal display device of one embodiment of the present invention.

FIG. 5 is an example of a top view of the pixel 100 illustrated in FIG. 1A. In FIG. 5, some components (e.g., a gate insulating film) are not illustrated for clarity of the top view of the pixel 100. FIG. 6 is a cross-sectional view taken along the dashed-dotted line A1-A2 and the dashed-dotted line A3-A4 in FIG. 5.

In the pixel 100 illustrated in FIG. 5 and FIG. 6, a conductive film 304 serving as the gate of the transistor 112 and the wiring GL is provided over the substrate 302 having an insulating surface. In addition, a first common electrode 318 serving as an electrode of the capacitor 113 and the first common electrode is provided over the substrate 302. That is, the potential $V_{COM1}$ is applied to the first common electrode 318.

An insulating film 306 is provided over the substrate 302 to cover the conductive film 304. An oxide semiconductor film 308 serving as a channel formation region of the transistor 112 is provided over the insulating film 306 in a region overlapping with the conductive film 304. A conductive film 310 and a conductive film 312 are formed over the oxide semiconductor film 308. A conductive film 313 formed in the same step as the conductive films 310 and 312 is provided over the insulating film 306. The conductive film 310 serves as the wiring SL and one of the source and drain of the transistor 112. The conductive film 312 serves as the other of the source and drain of the transistor 112. The conductive film 313 serves as a capacitor line.

An insulating film 314 is provided over the insulating film 306, the oxide semiconductor film 308, and the conductive films 310, 312, and 313. An insulating film 316 serving as a planarization film is provided over the insulating film 314. An opening 360 reaching the conductive film 312 is formed in the insulating films 314 and 316. In addition, an opening 362 reaching the conductive film 313 is formed in the insulating films 314 and 316.

The first common electrode 318 is provided over the insulating film 316. The first common electrode 318 is connected to the conductive film 313 through the opening 362. An insulating film 320 is provided over the insulating film 316 and the first common electrode 318. A pixel electrode 322 is provided over the insulating film 320 in a position overlapping with the first common electrode 318. The insulating film 320 has an opening 364 in a region overlapping with the opening 360. The conductive film 312 and the pixel electrode 322 are connected to each other through the openings 360 and 364. As in the top view of FIG. 5, the pixel electrode 322 has openings (slits). An alignment film 324 is provided over the insulating film 320 and the pixel electrode 322.

A substrate 330 is provided to face the substrate 302. A light-blocking film 332 having a function of blocking visible light, a color film 334 transmitting visible light within a certain wavelength range, an insulating film 336 in contact with the light-blocking film 332 and the color film 334, a second common electrode 338 in contact with the insulating film 336, and an alignment film 340 in contact with the second common electrode 338 are provided under the substrate 330. The insulating film 336 has a function of preventing the shapes of the surfaces of the light-blocking film 332 and the color film 334 from affecting the planarity of the second common electrode 338 or the alignment film 340. Note that a structure in which the insulating film 336 is not provided may be employed.

Between the substrate 302 and the substrate 330, a liquid crystal layer 350 containing a liquid crystal material is interposed between the alignment film 324 and the alignment film 340. The liquid crystal element 111 includes at least the first common electrode 318, the insulating film 320, the pixel electrode 322, the second common electrode 338, and the liquid crystal layer 350. Note that a negative liquid crystal material is used for the liquid crystal layer 350, and the specific resistivity of the liquid crystal material is greater than or equal to $1.0 \times 10^{13}$ $\Omega \cdot cm$ and less than or equal to $1.0 \times 10^{16}$ $\Omega \cdot cm$.

<Manufacturing Method>

An example of a method for manufacturing the pixel illustrated in FIG. 6 is described with reference to FIGS. 7A to 7D and FIGS. 8A to 8D.

Figure 7A:
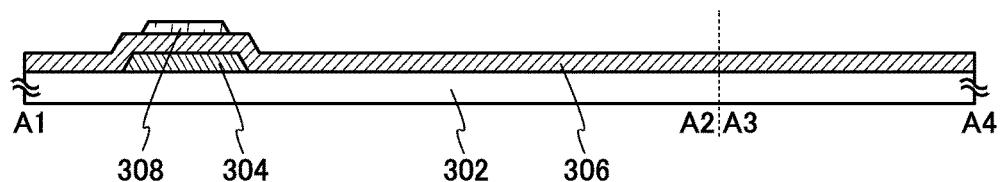
FIGS. 7A to 7D are cross-sectional views illustrating a method for manufacturing a pixel in a liquid crystal display device of one embodiment of the present invention.

As illustrated in FIG. 7A, a conductive film is formed over the substrate 302 and processed by etching or the like, whereby the conductive film 304 is formed. Next, the insulating film 306 is formed over the conductive film 304, and an oxide semiconductor film is formed over the insulating film 306. The oxide semiconductor film is processed by etching or the like into the oxide semiconductor film 308 with a separated island shape in a region overlapping with the conductive film 304.

The substrate 302 is preferably a substrate having heat resistance high enough to withstand a later manufacturing step; for example, a glass substrate, a ceramic substrate, a quartz substrate, or a sapphire substrate.

The conductive film 304 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. For example, the conductive film 304 may be a conductive film in which a copper film is stacked over a tungsten nitride film or a single-layer tungsten film.

The insulating film 306 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, in the case where the insulating film 306 has a two-layer structure, a silicon nitride film and a silicon oxide film may be used as the first layer and the second layer, respectively. A silicon oxynitride film may be used as the second layer instead of the silicon oxide film. A silicon nitride oxide film may be used as the first layer instead of the silicon nitride film.

As the silicon oxide film, a silicon oxide film with a low defect density is preferably used. Specifically, a silicon oxide film which has a spin density of $3\times10^{17}$ spins/cm$^3$ or less, preferably $5\times10^{16}$ spins/cm$^3$ or less corresponding to a signal at a g-factor of 2.001 in electron spin resonance (ESR) spectroscopy is used. As the silicon oxide film, a silicon oxide film having excess oxygen is preferably used. As the silicon nitride film, a silicon nitride film from which hydrogen and ammonia are less released is used. The amount of released hydrogen and ammonia is preferably measured by thermal desorption spectroscopy (TDS) analysis.

A material that can be used for the oxide semiconductor film 308 is described in detail in Embodiment 2. When the oxide semiconductor film used as the oxide semiconductor film 308 contains a large amount of hydrogen, the hydrogen and the oxide semiconductor are bonded to each other, so that part of the hydrogen becomes donors and generates electrons serving as carriers. As a result, the threshold voltage of the transistor shifts in the negative direction. Therefore, it is preferable that, after forming the oxide semiconductor film, dehydration treatment (dehydrogenation treatment) be performed to remove hydrogen or moisture from the oxide semiconductor film so that the oxide semiconductor film contains impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film.

Figure 7B:
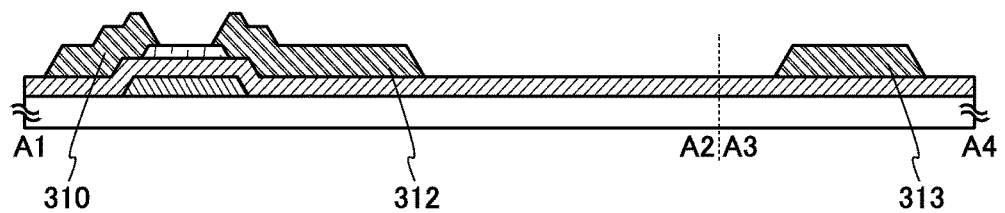

Next, a conductive film is formed over the insulating film 306 and the oxide semiconductor film 308 and processed by etching or the like, whereby the conductive films 310 and 312 in contact with the oxide semiconductor film 308 are formed, as illustrated in FIG. 7B. The conductive film 313 is formed over the insulating film 306 in the same step as the conductive films 310 and 312.

The conductive films 310, 312, and 313 are formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. As examples of the stacked-layer structure, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order are given. Note that a transparent conductive material containing indium oxide, tin oxide, or zinc oxide may be used. The conductive film can be formed by a sputtering method, for example.

Figure 7C:
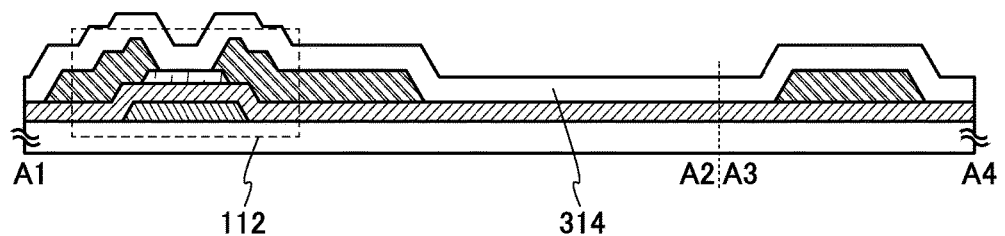

Next, as in FIG. 7C, the insulating film 314 is formed over the insulating film 306, the oxide semiconductor film 308, and the conductive films 310, 312, and 313.

For example, the silicon oxide film or the silicon oxynitride film which is used as the insulating film 314 can be formed under the following conditions: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber.

The source gas of the insulating film 314 is preferably a deposition gas containing silicon and an oxidizing gas. Typical examples of the deposition gas containing silicon include silane, disilane, trisilane, and silane fluoride. Examples of the oxidizing gas include oxygen, ozone, dinitrogen monoxide, and nitrogen dioxide.

In this embodiment, the insulating film 314 has a stacked-layer structure of a first insulating film and a second insulating film. For example, as the first insulating film, a 50-nm-thick silicon oxynitride film is formed by a plasma CVD method under the following conditions: silane with a flow rate of 20 sccm and dinitrogen monoxide with a flow rate of 3000 sccm are used as the source gases, the pressure in the treatment chamber is 40 Pa, the substrate temperature is 220° C., and a high-frequency power of 100 W is supplied to parallel plate electrodes with a high-frequency power supply of 27.12 MHz. Note that a plasma CVD apparatus is a parallel plate plasma CVD apparatus in which the electrode area is 6000 cm$^2$, and power per unit area (power density) into which supplied power is converted is $1.6\times10^{-2}$ W/cm$^2$. Under the above conditions, a silicon oxynitride film that passes oxygen can be formed.

As the second insulating film, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 260° C., preferably higher than or equal to 180° C. and lower than or equal to 230° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of 0.17 W/cm$^2$ to 0.5 W/cm$^2$, preferably 0.25 W/cm$^2$ to 0.35 W/cm$^2$ is supplied to an electrode provided in the treatment chamber.

As the deposition conditions of the second insulating film, the high-frequency power having the power density is supplied to the electrode in the treatment chamber having the pressure, so that the degradation efficiency of the source gas in plasma is increased, oxygen radicals are increased, and oxidation of the source gas is promoted. Thus, the oxygen content in the second insulating film becomes higher than that in the stoichiometric composition. However, in the case where the substrate temperature is within the above temperature range, the bond between silicon and oxygen is weak; thus, part of oxygen is released by heating. Accordingly, it is possible to form an oxide insulating film which contains oxygen at a higher proportion than the stoichiometric composition and from which part of oxygen is released by heating.

In this embodiment, as the second insulating film, a 400-nm-thick silicon oxynitride film is formed by a plasma CVD method under the following conditions: silane with a flow rate of 160 sccm and dinitrogen monoxide with a flow rate of 4000 sccm are used as the source gases, the pressure in the treatment chamber is 200 Pa, the substrate temperature is 220° C., and a high-frequency power of 1500 W is supplied to parallel plate electrodes with a high-frequency power supply of 27.12 MHz. Note that a plasma CVD apparatus is a parallel plate plasma CVD apparatus in which the electrode area is 6000 cm$^2$, and power per unit area (power density) into which supplied power is converted is $2.5\times10^{-1}$ W/cm$^2$.

It is preferable that heat treatment be performed at least after the formation of the insulating film 314 so that oxygen contained in the insulating film 314 enters the oxide semiconductor film 308 to fill oxygen vacancies in the oxide semiconductor film 308.

Figure 7D:
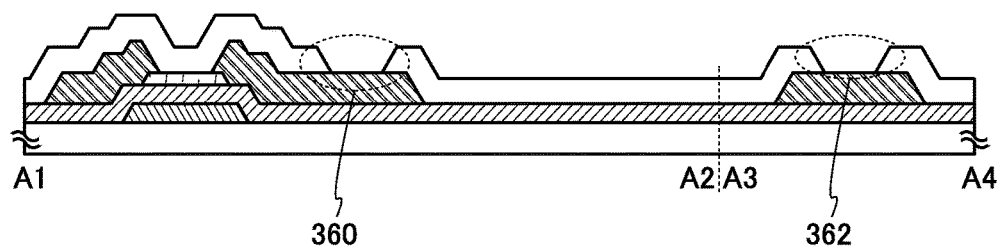

Next, as in FIG. 7D, a desired region in the insulating film 314 is processed, whereby the opening 360 reaching the conductive film 312 and the opening 362 reaching the conductive film 313 are formed.

The openings 360 and 362 are formed, for example, by a dry etching method or a wet etching method. Alternatively, the openings 360 and 362 may be formed by a combination of a dry etching method and a wet etching method.

Figure 8A:
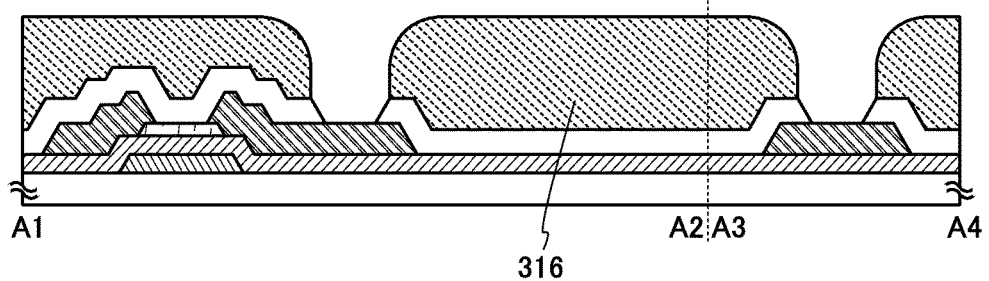
FIGS. 8A to 8D are cross-sectional views illustrating the method for manufacturing a pixel in a liquid crystal display device of one embodiment of the present invention.

Next, as in FIG. 8A, the insulating film 316 having an opening is formed. The insulating film 316 has openings in positions corresponding to the openings 360 and 362. The insulating film 316 which serves as a base film for the first common electrode 318 has a function of preventing a transistor, a conductive film, or the like from forming unevenness on the first common electrode 318. That is, the insulating film 316 has a function as a planarization film. For the insulating film 316, an acrylic resin, a polyimide resin, or the like can be used.

Figure 8B:
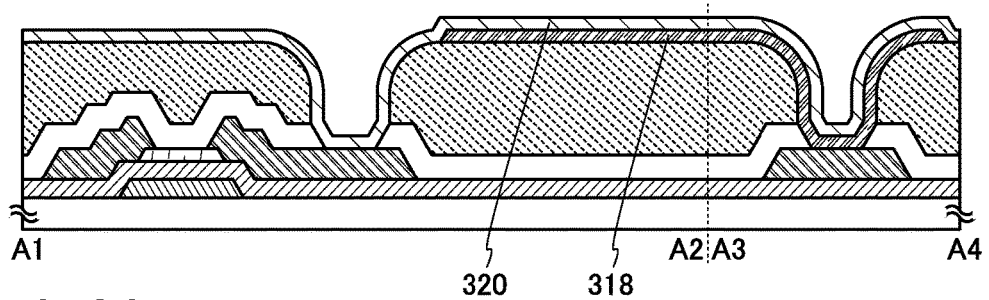

Next, as in FIG. 8B, the first common electrode 318 is formed over the insulating film 316. Then, the insulating film 320 is formed to cover the insulating film 316 and the first common electrode 318. The first common electrode 318 is connected to the conductive film 313 through the opening 362.

For example, a conductive film containing any of the followings can be used as the first common electrode 318: indium oxide containing tungsten oxide; indium zinc oxide containing tungsten oxide; indium oxide containing titanium oxide; indium tin oxide containing titanium oxide; indium tin oxide; indium zinc oxide; and indium tin oxide to which silicon oxide is added. The first common electrode 318 can be formed by a sputtering method.

As the insulating film 320, a silicon oxide film, a silicon oxynitride film, a silicon nitride film, a silicon nitride oxide film, or the like can be used. In particular, a silicon nitride film or a silicon nitride oxide film is preferably used as the insulating film 320 because the insulating film 320 has a function as a dielectric of a capacitor and a function as a protection film for the transistor.

For example, a silicon nitride film, a silicon nitride oxide film, or the like having a thickness of from 50 nm to 400 nm can be used as the insulating film 320. In this embodiment, a silicon nitride film having a thickness of 100 nm is used as the insulating film 320.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. Note that in the case where the silicon nitride film is formed at a high temperature, a phenomenon in which oxygen is released from the oxide semiconductor film 308 and the carrier concentration is increased is caused in some cases; therefore, the upper limit of the temperature is a temperature at which the phenomenon is not caused.

Figure 8C:
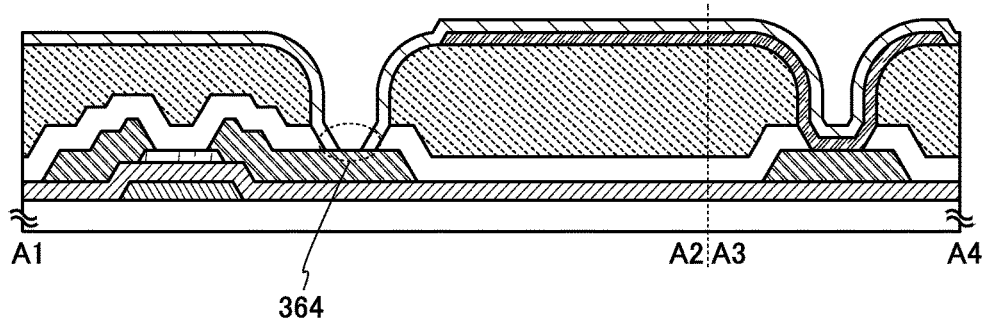

Next, as in FIG. 8C, the opening 364 is formed in the insulating film 320. The opening 364 is formed in a position corresponding to the opening 360 formed in the insulating film 316. The opening 364 is formed to expose the conductive film 312. The method for forming the openings 360 and 362 can be referred to for a method for forming the opening 364.

Figure 8D:
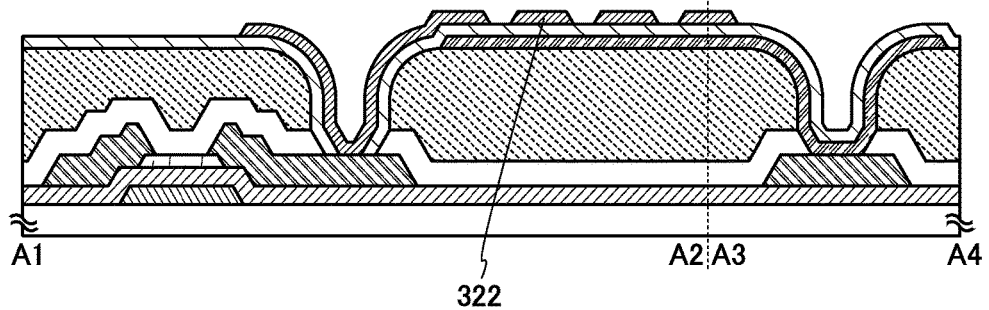

Next, as in FIG. 8D, the pixel electrode 322 is formed over the insulating film 320. The pixel electrode 322 is connected to the conductive film 312 through the openings 360 and 364.

The pixel electrode 322 is formed in such a manner that a transparent conductive film is formed over the insulating film 320 and processed by etching or the like.

As the pixel electrode 322, a conductive film containing the following can be used: indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

Next, an alignment film 324 (not illustrated) is formed over the insulating film 320 and the pixel electrode 322. The alignment film 324 can be formed by a rubbing method, an optical alignment method, or the like.

Through the above steps, the components formed over the substrate 302 can be formed.

Next, a method for manufacturing a structure formed below the substrate 330 facing the substrate 302 is described below.

First, the substrate 330 is prepared. For materials of the substrate 330, the materials used for the substrate 302 can be referred to. Next, the light-blocking film 332 and the color film 334 which are in contact with the substrate 330 are formed. The light-blocking film 332 and the color film 334 are each formed in a desired position with any of various materials by a printing method, an inkjet method, an etching method using a photolithography technique, or the like.

Then, the insulating film 336 in contact with the light-blocking film 332 and the color film 334 is formed. For the insulating film 336, an organic insulating film of an acrylic resin or the like can be used. With the insulating film 336, an impurity or the like contained in the color film 334 can be prevented from diffusing into the liquid crystal layer 350 side, for example.

The second common electrode 338 in contact with the insulating film 336 is formed. A conductive layer that can be used for the second common electrode 338 can be formed using a light-transmitting conductive material such as indium oxide containing tungsten oxide; indium zinc oxide containing tungsten oxide; indium oxide containing titanium oxide; indium tin oxide containing titanium oxide; indium tin oxide (hereinafter referred to as ITO); indium zinc oxide; or indium tin oxide to which silicon oxide is added. The conductive layer that can be used for the second common electrode 338 can be formed by a sputtering method, for example.

Next, the alignment film 340 in contact with the second common electrode 338 is formed. The method for forming the alignment film 324 can be referred to for a method for forming the alignment film 340.

Through the above steps, the structure formed below the substrate 330 can be formed.

After that, the liquid crystal layer 350 is formed between the substrate 302 and the substrate 330. The liquid crystal layer 350 can be formed by a dispenser method (a dropping method), or an injecting method by which liquid crystal is injected using a capillary phenomenon after the substrate 302 and the substrate 330 are bonded to each other.

Through the above steps, the pixel illustrated in FIG. 6 can be formed.

The structures, the methods, and the like described in this embodiment can be combined as appropriate with any of the structures, the methods, and the like described in the other embodiments.

Embodiment 2

In this embodiment, an oxide semiconductor film that can be used in the liquid crystal display device of one embodiment of the present invention is described.

A highly purified oxide semiconductor (a purified OS) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly purified oxide semiconductor film has extremely low off-state current and high reliability.

Specifically, various experiments can prove low off-state current of a transistor including a channel formation region in a highly purified oxide semiconductor film. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 V to 10 V. In that case, it can be seen that off-state current normalized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly purified oxide semiconductor film was used for the channel formation region of the transistor, and the off-state current of the transistor was measured from a change in the amount of electric charge of the capacitor per unit hour. As a result, it was found that, in the case where the voltage between the source electrode and the drain electrode of the transistor is 3 V, a lower off-state current of several tens of yoctoamperes per micrometer is obtained. Accordingly, the transistor using the highly purified oxide semiconductor film for the channel formation region has much lower off-state current than a crystalline silicon transistor.

Unless otherwise specified, in the case of an n-channel transistor, the off-state current in this specification is a current that flows between a source and a drain when the potential of a gate is lower than or equal to 0 with the potential of the source as a reference potential while the potential of the drain is higher than those of the source and the gate. Meanwhile, in the case of a p-channel transistor, the off-state current in this specification is a current that flows between a source and a drain when the potential of a gate is higher than or equal to 0 with the potential of the source as a reference potential while the potential of the drain is lower than those of the source and the gate.

As the semiconductor film, at least indium (In) or zinc (Zn) is preferably included as an oxide semiconductor. The oxide semiconductor preferably contains, in addition to In and Zn, gallium (Ga) serving as a stabilizer that reduces variations in electric characteristics among transistors using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electric characteristics can be formed by sputtering or a wet process. Further, unlike silicon carbide, gallium nitride, or gallium oxide, the In—Ga—Zn-based oxide allows a transistor with favorable electric characteristics to be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1, In:Ga:Zn=1:1:1.2 (=5:5:6), In:Ga:Zn=2:2:1; or In:Ga:Zn=3:1:2, or an oxide with an atomic ratio close to the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

Here, the CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° is derived from the (311) plane of a ZnGa$_2$O$_4$ crystal; such a peak indicates that a ZnGa$_2$O$_4$ crystal is included in part of the CAAC-OS film including the InGaZnO$_4$ crystal. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, and examples of the impurity include hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electric characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electric characteristics in some cases.

In a transistor using the CAAC-OS film, change in electric characteristics due to irradiation with visible light or ultraviolet light is small.

For example, the CAAC-OS film is formed by a sputtering method using a polycrystalline metal oxide target. When ions collide with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like or pellet-like sputtered particle reaches a substrate in the state of maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is from 100° C. to 740° C., preferably from 200° C. to 500° C. By increasing the substrate heating temperature during the deposition, when the flat-plate-like or pellet-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

The oxide semiconductor layer may have a stacked-layer structure.

Here, an example in which the oxide semiconductor film 308 used in the transistor 112 illustrated in FIG. 6 has a stacked-layer structure including an oxide semiconductor film 307 and an oxide semiconductor film 309 is described with reference to FIGS. 9A and 9B.

Figure 9A:
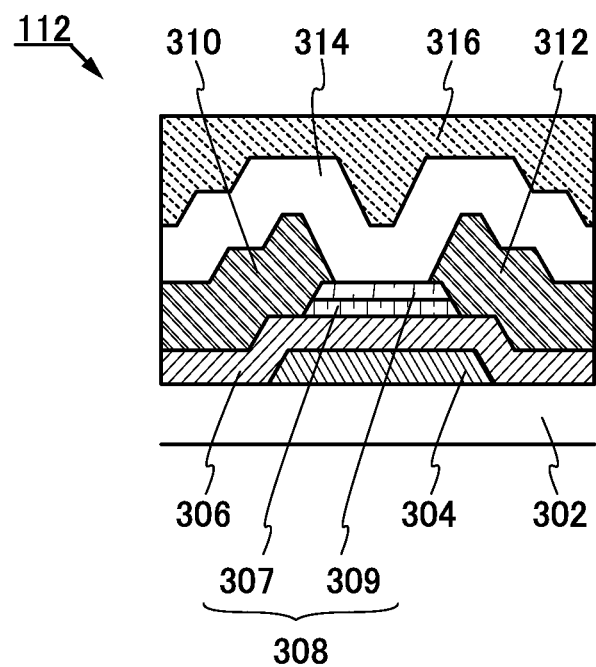
FIG. 9A is a cross-sectional view illustrating a transistor that can be used in a liquid crystal display device of one embodiment of the present invention and FIG. 9B is a diagram illustrating an energy band of an oxide semiconductor.

FIG. 9A illustrates a cross-sectional structure in which the oxide semiconductor film used in the transistor 112 has a stacked-layer structure including the oxide semiconductor film 307 and the oxide semiconductor film 309. Thus, the other components are the same as those of the transistor 112 illustrated in FIG. 6; hence, the above description can be referred to.

Metal oxides used for the oxide semiconductor film 307 and the oxide semiconductor film 309 preferably contain at least one same constituent element. Alternatively, the constituent elements of the oxide semiconductor film 307 may be the same as those of the oxide semiconductor film 309 and the composition of the constituent elements of the oxide semiconductor film 307 may be different from those of the oxide semiconductor film 309.

In the case where the oxide semiconductor film 307 is In-M-Zn oxide (M represents Al, Ga, Ge, Y, Zr, Sn, La, Ce, or Hf), it is preferable that the atomic ratio of metal elements of a sputtering target used for forming a film of the In-M-Zn oxide satisfy In≥M and Zn≥M. As the atomic ratio of metal elements of the sputtering target, In:M:Zn=1:1:1, In:M:Zn=5:5:6 (1:1:1.2), and In:M:Zn=3:1:2 are preferable. Note that the proportion of the atomic ratio of the oxide semiconductor film 307 formed using the above-described sputtering target varies within a range of ±20% as an error.

When an In-M-Zn oxide is used for the oxide semiconductor film 307, the proportions of In and M, not taking Zn and O into consideration, is preferably as follows: the atomic percentage of In is greater than or equal to 25 at. % and the proportion of M is less than 75 at. %; more preferably, the proportion of In is greater than or equal to 34 at. % and the proportion of M is less than 66 at. %.

The energy gap of the oxide semiconductor film 307 is 2 eV or more, preferably 2.5 eV or more, further preferably 3 eV or more. The off-state current of the transistor 112 can be reduced by using an oxide semiconductor having a wide energy gap.

The thickness of the oxide semiconductor film 307 is greater than or equal to 3 nm and less than or equal to 200 nm, preferably greater than or equal to 3 nm and less than or equal to 100 nm, further preferably greater than or equal to 3 nm and less than or equal to 50 nm.

The oxide semiconductor film 309 is typically In—Ga oxide, In—Zn oxide, or In-M-Zn oxide (M represents Al, Ga, Ge, Y, Zr, Sn, La, Ce, or Hf). The energy at the conduction band bottom thereof is closer to a vacuum level than that of the oxide semiconductor film 307 is, and typically, the difference between the energy at the conduction band bottom of the oxide semiconductor film 309 and the energy at the conduction band bottom of the oxide semiconductor film 307 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 309 and the electron affinity of the oxide semiconductor film 307 is greater than or equal to 0.05 eV, greater than or equal to 0.07 eV, greater than or equal to 0.1 eV, or greater than or equal to 0.15 eV and also less than or equal to 2 eV, less than or equal to 1 eV, less than or equal to 0.5 eV, or less than or equal to 0.4 eV.

When the oxide semiconductor film 309 contains a larger amount of the element M in an atomic ratio than the amount of In in an atomic ratio, any of the following effects may be obtained: (1) the energy gap of the oxide semiconductor film 309 is widened; (2) the electron affinity of the oxide semiconductor film 309 decreases; (3) an impurity from the outside is blocked; (4) an insulating property increases as compared to the oxide semiconductor film 307. Further, oxygen vacancies are less likely to be generated in the oxide semiconductor film 309 containing a larger amount of M in an atomic ratio than the amount of In in an atomic ratio because M is a metal element which is strongly bonded to oxygen.

When an In-M-Zn oxide is used for the oxide semiconductor film 309, the proportions of In and M, not taking Zn and O into consideration, is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %.

Further, in the case where each of the oxide semiconductor film 307 and the oxide semiconductor film 309 is In-M-Zn oxide (M represents Al, Ga, Ge, Y, Zr, Sn, La, Ce, or Hf), the proportion of M atoms in the oxide semiconductor film 309 is higher than the proportion of M atoms in the oxide semiconductor film 307. Typically, the proportion of M atoms in the oxide semiconductor layer 309 is higher than or equal to 1.5 times, preferably higher than or equal to 2 times, further preferably higher than or equal to 3 times as large as that in the oxide semiconductor film 307.

In the case where the oxide semiconductor film 309 has an atomic ratio of In to M and Zn which is $x_1:y_1:z_1$ and the oxide semiconductor film 307 has an atomic ratio of In to M and Zn which is $x_2:y_2:z_2$, $y_1/x_1$ is larger than $y_2/x_2$, preferably $y_1/x_1$ is 1.5 times or more as large as $y_2/x_2$. It is further preferable that $y_1/x_1$ be twice or more as large as $y_2/x_2$. It is still further preferable that $y_1/x_1$ be three or more times as large as $y_2/x_2$. In this case, it is preferable that in the oxide semiconductor film, $y_2$ be higher than or equal to $x_2$ because the transistor 102 including the oxide semiconductor film can have stable electric characteristics. However, when $y_2$ is larger than or equal to three or more times $x_2$, the field-effect mobility of the transistor 102 including the oxide semiconductor film is reduced. Thus, it is preferable that $y_2$ be lower than three times $x_2$.

Further, in the case where the oxide semiconductor film 309 is an In-M-Zn oxide film, the atomic ratio of metal elements of a sputtering target used for forming the In-M-Zn oxide preferably satisfies M>In, and more preferably, Zn also satisfies Zn≥M. As the atomic ratio of metal elements of the sputtering target, In:Ga:Zn=1:3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable. Note that the proportion of each metal element in the atomic ratio of each of the oxide semiconductor film 307 and the oxide semiconductor film 309 formed using the above-described sputtering target varies within a range of ±20% as an error.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor film 307 be set to appropriate values.

Note that the oxide semiconductor film 309 also functions as a film which relieves damage to the oxide semiconductor film 307 at the time of forming the insulating film 314 later. The thickness of the oxide semiconductor film 309 is greater than or equal to 3 nm and less than or equal to 100 nm, preferably greater than or equal to 3 nm and less than or equal to 50 nm.

When silicon or carbon which is one of elements belonging to Group 14 is contained in the oxide semiconductor film 307 in the transistor 112, the number of oxygen vacancies is increased, and the oxide semiconductor film 307 is changed to an n-type. Thus, the concentration of silicon or carbon (the concentration is measured by SIMS) in the oxide semiconductor film 307 or the concentration of silicon or carbon (the concentration is measured by SIMS) in the vicinity of the interface between the oxide semiconductor film 309 and the oxide semiconductor film 307 is set to be lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor film 307, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 307.

Further, when nitrogen is contained in the oxide semiconductor film 307, electrons serving as carriers are generated to increase the carrier density, so that the oxide semiconductor film 307 easily becomes n-type. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

Note that in the transistor 112 shown in FIG. 9A, the oxide semiconductor film 309 is provided between the oxide semiconductor film 307 and the insulating film 314. The oxide semiconductor film 307 is positioned on the conductive film 304 (serving as a gate) side and serves as a main path of carriers. Hence, if trap states are formed between the oxide semiconductor film 309 and the insulating film 314 owing to impurities and defects, electrons flowing in the oxide semiconductor film 307 are less likely to be captured by the trap states because there is a distance between the trap states and the oxide semiconductor film 307. Accordingly, the amount of on-state current of the transistor 112 can be increased, and the field-effect mobility can be increased. When the electrons are captured by the trap states, the electrons become negative fixed charges. As a result, a threshold voltage of the transistor 112 fluctuates. However, by the distance between the oxide semiconductor film 307 and the trap states, capture of the electrons by the trap states can be reduced, and accordingly a fluctuation of the threshold voltage can be reduced.

Note that the oxide semiconductor film 307 and the oxide semiconductor film 309 are not formed by simply stacking each layer, but are formed to form a continuous junction (here, in particular, a structure in which the energy of the bottom of the conduction band is changed continuously between each film). In other words, a stacked-layer structure in which there exist no impurity which forms a defect level such as a trap center or a recombination center at each interface is provided. If an impurity exists between the oxide semiconductor film 307 and the oxide semiconductor film 309 which are stacked, a continuity of the energy band is damaged, and the carrier is captured or recombined at the interface and then disappears.

To form the continuous junction, each film needs to be stacked successively without exposure to the atmosphere using a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor film, is removed as much as possible. Alternatively, a turbo-molecular pump is preferably used in combination with a cold trap to prevent backflow of gas, especially a gas containing carbon or hydrogen into the chamber through an evacuation system.

Here, a band structure of the stacked-layer structure included in the transistor 112 is described with reference to FIG. 9B.

Figure 9B:
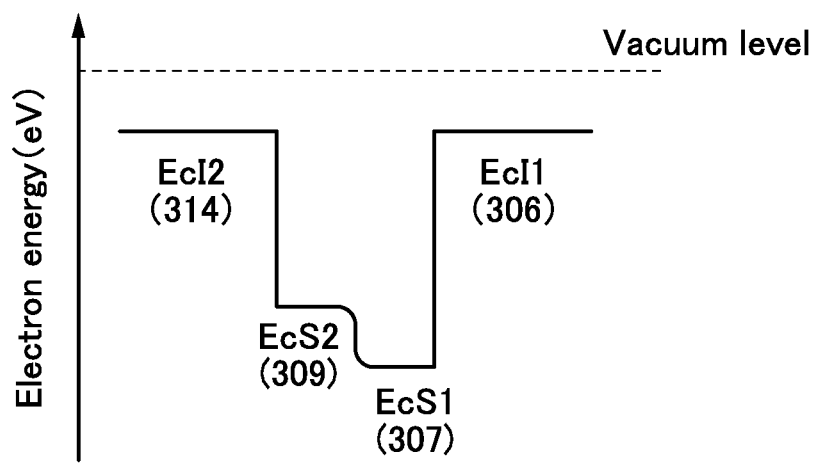

FIG. 9B schematically shows a part of the band structure included in the transistor 112. Here, the case where silicon oxide layers are provided as the insulating film 306 and the insulating film 314 is shown. In FIG. 9B, EcI1 denotes the energy of the bottom of the conduction band in the silicon oxide layer used as the insulating film 306; EcS1 denotes the energy of the bottom of the conduction band in the oxide semiconductor film 307; EcS2 denotes the energy of the bottom of the conduction band in the oxide semiconductor film 309; and EcI2 denotes the energy of the bottom of the conduction band in the silicon oxide layer used as the insulating film 314.

As shown in FIG. 9B, there is no energy barrier between the oxide semiconductor film 307 and the oxide semiconductor film 309, and the energy level of the bottom of the conduction band gradually changes therebetween. In other words, the energy level of the bottom of the conduction band is continuously changed. This is because the oxide semiconductor film 307 contains an element contained in the oxide semiconductor film 309 and oxygen is transferred between the oxide semiconductor film 307 and the oxide semiconductor film 309, so that a mixed layer is formed.

As shown in FIG. 9B, in the oxide semiconductor film 308, the oxide semiconductor film 307 serves as a well; in the transistor including the oxide semiconductor film 308, a channel formation region is formed in the oxide semiconductor film 307. Note that since the energy of the bottom of the conduction band of the oxide semiconductor film 308 is continuously changed, it can be said that the oxide semiconductor film 307 and the oxide semiconductor film 309 have a continuous junction.

Although trap states due to defects or impurities such as silicon or carbon, which is a constituent element of the insulating film 314, might be formed in the vicinity of the interface between the oxide semiconductor film 309 and the insulating film 314 as shown in FIG. 9B, the oxide semiconductor film 307 can be distanced from the trap states owing to existence of the oxide semiconductor film 309. However, when the energy difference between EcS1 and EcS2 is small, an electron in the oxide semiconductor film 307 might reach the trap state by passing over the energy difference. When the electron is captured by the trap state, negative fixed electric charge is generated at the interface with the insulating film, so that the threshold voltage of the transistor shifts in the positive direction. Therefore, it is preferable that the energy difference between EcS1 and EcS2 be 0.1 eV or more, further preferably 0.15 eV or more because a change in the threshold voltage of the transistor is prevented and stable electric characteristics are obtained.

By using the above-described oxide semiconductor for a transistor in the liquid crystal display device of one embodiment of the present invention, display of images on a pixel portion can be maintained even after the writing of image signals to the pixel portion is stopped. Furthermore, by using the above transistor as an element for controlling the supply of voltage to a liquid crystal element included in the pixel, the voltage applied to the liquid crystal element can be held for a long time.

The structures, the methods, and the like described in this embodiment can be combined as appropriate with any of the structures, the methods, and the like described in the other embodiments.

Embodiment 3

In this embodiment, a configuration example of a pixel in a liquid crystal display device of one embodiment of the present invention, which is different from the pixel 100 illustrated in the top view of FIG. 5 and the cross-sectional view of FIG. 6 in Embodiment 1, is described with reference to FIG. 10 and FIG. 11.

Figure 10:
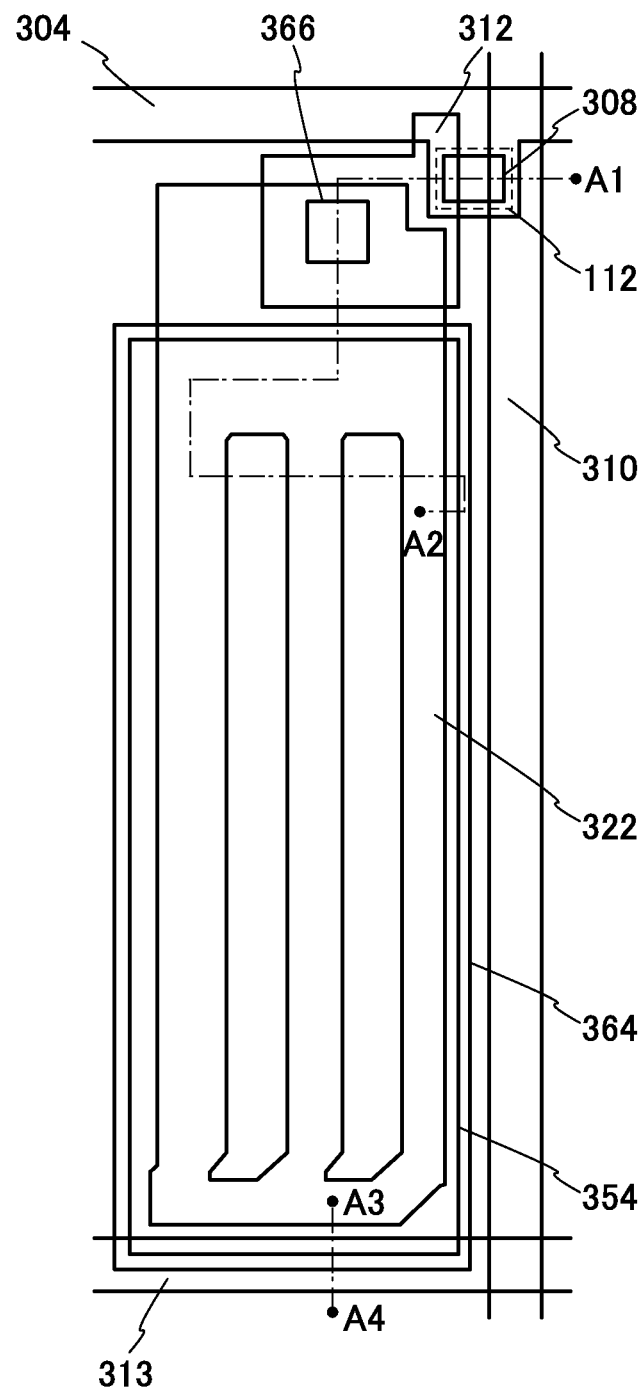
FIG. 10 is a top view illustrating a pixel in a liquid crystal display device of one embodiment of the present invention.

FIG. 10 is an example of a top view of the pixel 100 illustrated in FIG. 1A. In FIG. 10, some components (e.g., a gate insulating film) are not illustrated for clarity of the top view of the pixel 100. FIG. 11 is a cross-sectional view taken along the dashed-dotted line A1-A2 and the dashed-dotted line A3-A4 in FIG. 10.

Figure 11:
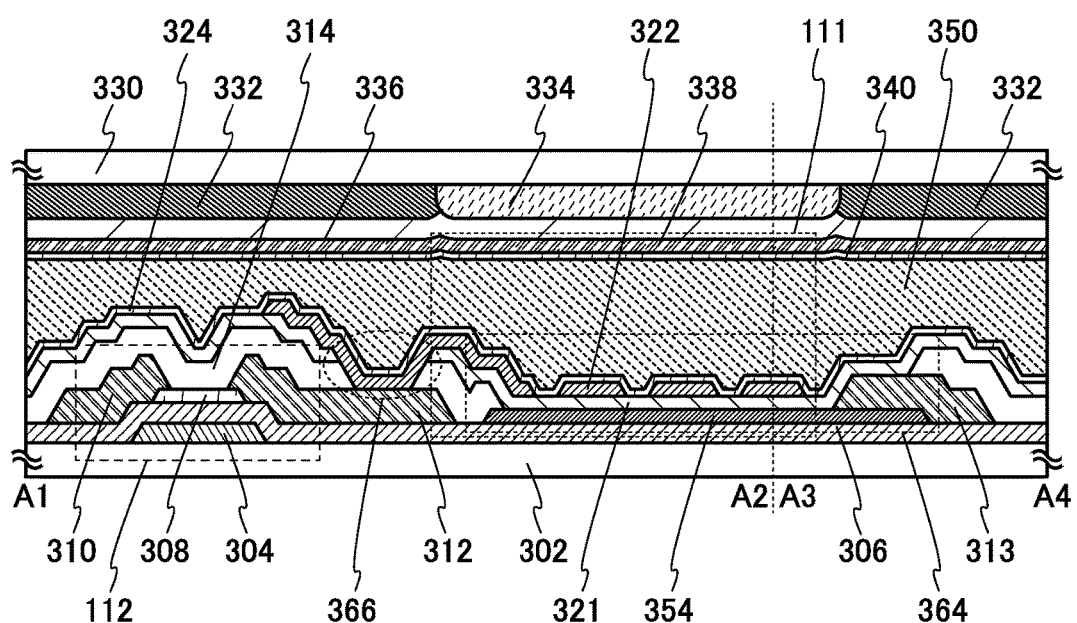
FIG. 11 is a cross-sectional view illustrating a pixel in a liquid crystal display device of one embodiment of the present invention.

In the pixel 100 illustrated in FIG. 10 and FIG. 11, a conductive film 304 serving as the gate of the transistor 112 and the wiring GL is provided over the substrate 302 having an insulating surface. In addition, an electrode 354 serving as an electrode of the capacitor 113 and the first common electrode is provided over the substrate 302.

An insulating film 306 is provided over the substrate 302 to cover the conductive film 304. An oxide semiconductor film 308 serving as a channel formation region of the transistor 112 is provided over the insulating film 306 in a region overlapping with the conductive film 304. A conductive film 310 and a conductive film 312 are formed over the oxide semiconductor film 308. A conductive film 313 formed in the same step as the conductive films 310 and 312 is provided over the electrode 354 and the insulating film 306. The conductive film 310 serves as the wiring SL and one of the source and drain of the transistor 112. The conductive film 312 serves as the other of the source and drain of the transistor 112. The conductive film 313 serves as a capacitor line.

The electrode 354 is formed in the same step as the oxide semiconductor film 308. The electrode 354 is a conductive oxide semiconductor having higher electrical conductivity than the oxide semiconductor film 308. The electrode 354 is provided in contact with an insulating film 321 and diffusion of hydrogen contained in the insulating film 321 into the electrode 354 increases the electrical conductivity of the electrode 354. In addition, a region in the electrode 354 in contact with the conductive film 313 has high electrical conductivity because the region is not in contact with the insulating film 314 and oxygen vacancies in the oxide semiconductor are not filled. Accordingly, although the electrode 354 is an oxide semiconductor film formed in the same step as the oxide semiconductor film 308, it serves as an electrode.

The insulating film 314 is provided to cover the oxide semiconductor film 308 and the conductive films 310 and 312. The insulating film 314 covers one end portion of the electrode 354 and one end portion of the conductive film 313. The insulating film 314 has the opening 364 through which part of the electrode 354 and part of the conductive film 313 are exposed.

The insulating film 321 is provided over the insulating film 314, the electrode 354, and the conductive film 313. An opening 366 reaching the conductive film 312 is formed in the insulating films 314 and 321. The pixel electrode 322 is provided over the insulating film 321, and is connected to the conductive film 312 through the opening 366. The pixel electrode 322 is provided in a position overlapping with the electrode 354 serving as the first common electrode, and has openings (slits) as illustrated in the top view of FIG. 10. The alignment film 324 is provided over the insulating film 321 and the pixel electrode 322.

A substrate 330 is provided to face the substrate 302. A light-blocking film 332 having a function of blocking visible light, a color film 334 transmitting visible light within a certain wavelength range, an insulating film 336 in contact with the light-blocking film 332 and the color film 334, a second common electrode 338 in contact with the insulating film 336, and an alignment film 340 in contact with the second common electrode 338 are provided under the substrate 330.

Between the substrate 302 and the substrate 330, a liquid crystal layer 350 containing a liquid crystal material is interposed between the alignment film 324 and the alignment film 340. The liquid crystal element 111 includes the electrode 354 serving as the first common electrode, the insulating film 321, the pixel electrode 322, and the second common electrode 338. Note that a negative liquid crystal material is used for the liquid crystal layer 350, and the specific resistivity of the liquid crystal material is greater than or equal to $1.0 \times 10^{13}$ Ω·cm and less than or equal to $1.0 \times 10^{16}$ Ω·cm.

The configuration of the pixel 100 of this embodiment is different from the configuration of the pixel 100 illustrated in FIG. 5 and FIG. 6 of Embodiment 1 mainly in the following points: an insulating film serving as a planarization film is not used; the electrode 354 serving as the first common electrode is formed in the same step as the oxide semiconductor film 308; and the conductive film 313 serving as a capacitor line is provided in contact with the electrode 354.

Since a planarization film is not used, impurities (e.g., water) contained in the planarization film can be prevented from entering the oxide semiconductor film 308. Thus, the reliability of the transistor 112 including the oxide semiconductor film 308 can be improved, leading to a liquid crystal display device with high display quality.

An example of a method for manufacturing the pixel illustrated in FIG. 11 is described with reference to FIGS. 12A to 12D and FIGS. 13A to 13C.

Figure 12A:
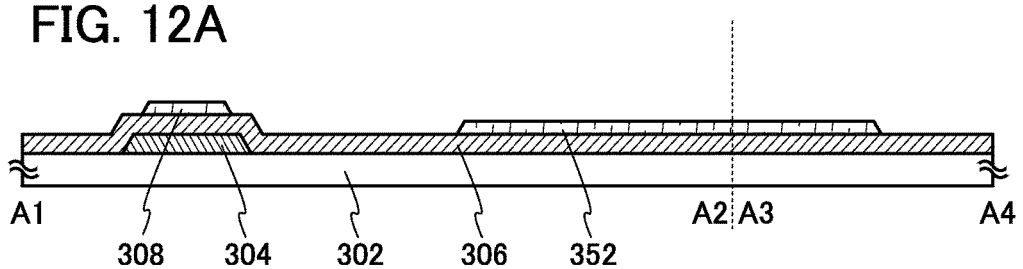
FIGS. 12A to 12D are cross-sectional views illustrating a method for manufacturing a pixel in a liquid crystal display device of one embodiment of the present invention.

As illustrated in FIG. 12A, a conductive film is formed over the substrate 302 and processed by etching or the like, whereby the conductive film 304 is formed. Next, the insulating film 306 is formed over the conductive film 304, and an oxide semiconductor film is formed over the insulating film 306. The oxide semiconductor film is processed by etching or the like into the oxide semiconductor film 308 and the oxide semiconductor film 352. The oxide semiconductor film 308 has a separated island shape and is positioned in a region overlapping with the conductive film 304. The oxide semiconductor film 352 is apart from the oxide semiconductor film 308.

For the substrate 302, the conductive film 304, the insulating film 306, and the oxide semiconductor film 308, the materials and formation methods for the substrate 302, the conductive film 304, the insulating film 306, and the oxide semiconductor film 308 described in Embodiment 1 can be referred to. The oxide semiconductor film 352 can be formed by using the same material and formation method as the oxide semiconductor film 308.

Figure 12B:
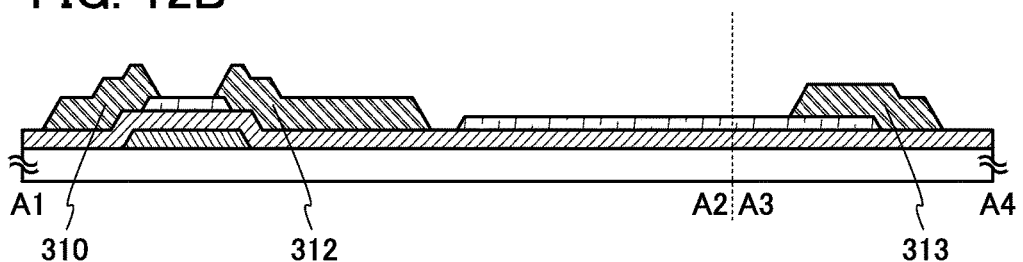

Next, a conductive film is formed over the insulating film 306 and the oxide semiconductor films 308 and 352 and processed by etching or the like, whereby the conductive films 310 and 312 in contact with the oxide semiconductor film 308 and the conductive film 313 in contact with the oxide semiconductor film 352 are formed, as illustrated in FIG. 12B.

For the conductive films 310, 312, and 313, the materials and formation method for the conductive films 310, 312, and 313 described in Embodiment 1 can be referred to.

Figure 12C:
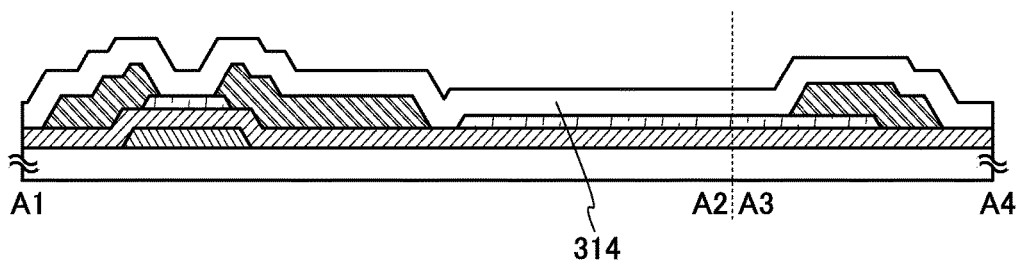

Next, as in FIG. 12C, the insulating film 314 is formed over the insulating film 306, the oxide semiconductor films 308 and 352, and the conductive films 310, 312, and 313.

For the insulating film 314, the material and formation method for the insulating film 314 described in Embodiment 1 can be referred to.

Figure 12D:
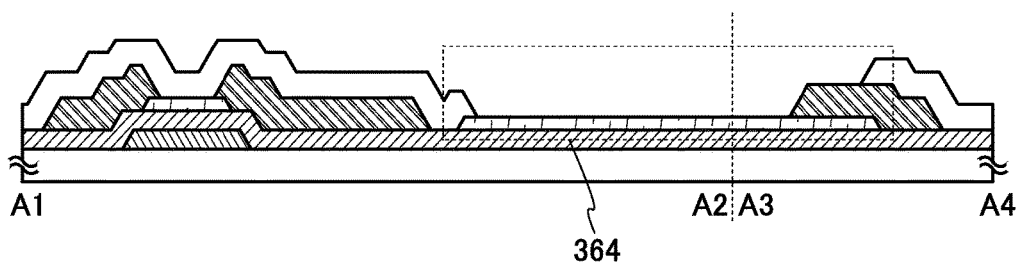

Next, as in FIG. 12D, the insulating film 314 is processed by etching or the like, whereby the opening 364 is formed to expose part of the oxide semiconductor film 352 and part of the conductive film 313. Note that a surface of the conductive film 313 is not necessarily exposed through the opening 364 as long as at least the oxide semiconductor film 352 is exposed.

The opening 364 is formed, for example, by a dry etching method or a wet etching method. Alternatively, the opening 364 may be formed by a combination of a dry etching method and a wet etching method.

Figure 13A:
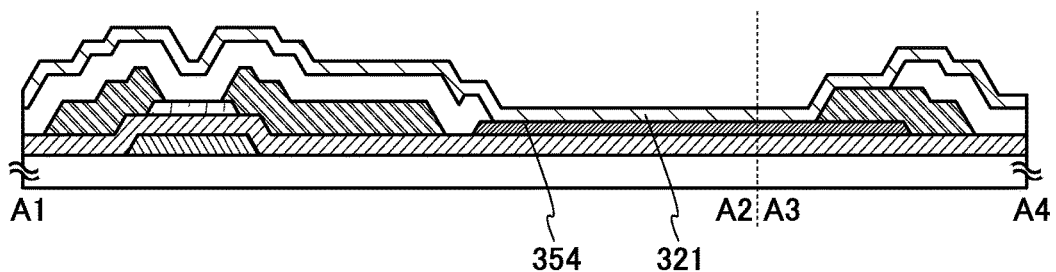
FIGS. 13A to 13C are cross-sectional views illustrating a method for manufacturing a pixel in a liquid crystal display device of one embodiment of the present invention.

Next, as in FIG. 13A, the insulating film 321 is formed to cover the insulating film 314 and the opening 364.

The insulating film 321 is formed using a material which prevents diffusion of impurities from the outside, such as water, alkali metal, and alkaline earth metal, into the oxide semiconductor film, and the material further includes hydrogen. Thus, when hydrogen in the insulating film 321 is diffused into the oxide semiconductor film 352, hydrogen is bonded to oxygen or to oxygen vacancies to generate electrons that are carriers in the oxide semiconductor film 352. As a result, the oxide semiconductor film 352 has higher conductivity than the oxide semiconductor film 308, and becomes the electrode 354 serving as the first common electrode.

For example, a silicon nitride film, a silicon nitride oxide film, or the like having a thickness of from 50 nm to 400 nm can be used as the insulating film 321. In this embodiment, a silicon nitride film having a thickness of 100 nm is used as the insulating film 321.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. Note that in the case where the silicon nitride film is formed at a high temperature, a phenomenon in which oxygen is released from the oxide semiconductor film 308 and the carrier concentration is increased is caused in some cases; therefore, the upper limit of the temperature is a temperature at which the phenomenon is not caused.

Although not illustrated in FIG. 11 and FIGS. 13A to 13C, an insulating film may be formed after the formation of the insulating film 321. As the insulating film, for example, a silicon oxide film formed using an organosilane gas by a PE-CVD method can be used. The silicon oxide film can be formed to a thickness of greater than or equal to 300 nm and less than or equal to 600 nm. For example, any of the following silicon-containing compound can be used for the organosilane gas: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); and trisdimethylaminosilane ($SiH(N(CH_3)_2)_3$). For example, the silicon oxide film is formed using an organosilane gas and oxygen by a PE-CVD method at a substrate temperature of 200° C. or higher and 550° C. or lower, preferably 220° C. or higher and 500° C. or lower, further preferably 300° C. or higher and 450° C. or lower.

The insulating film formed over the insulating film 321 can smooth an uneven surface caused by a transistor or the like. Furthermore, since the insulating film is formed using an inorganic material, the insulating film contains fewer impurities that adversely affect an oxide semiconductor film than a resin planarization film using an organic material.

It is preferable that heat treatment be performed at least after the formation of the insulating film 314 so that oxygen contained in the insulating film 314 is transferred to the oxide semiconductor film 308 to fill oxygen vacancies in the oxide semiconductor film 308.

Figure 13B:
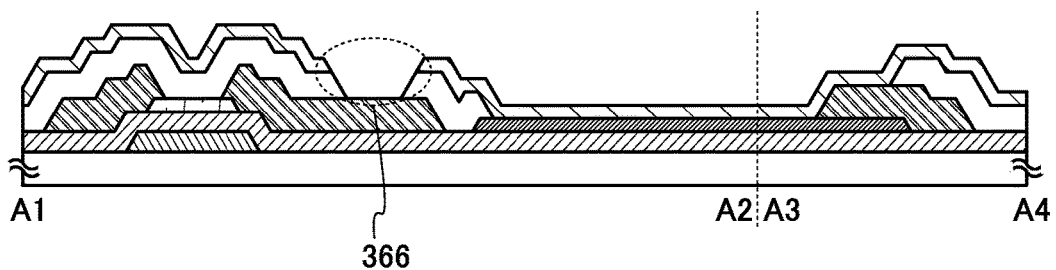

Next, as in FIG. 13B, desired regions in the insulating films 314 and 321 are removed, whereby the opening 366 reaching the conductive film 312 is formed.

The opening 366 is formed by, for example, a dry etching method or a wet etching method. Alternatively, the opening 366 may be formed by a combination of a dry etching method and a wet etching method.

Figure 13C:
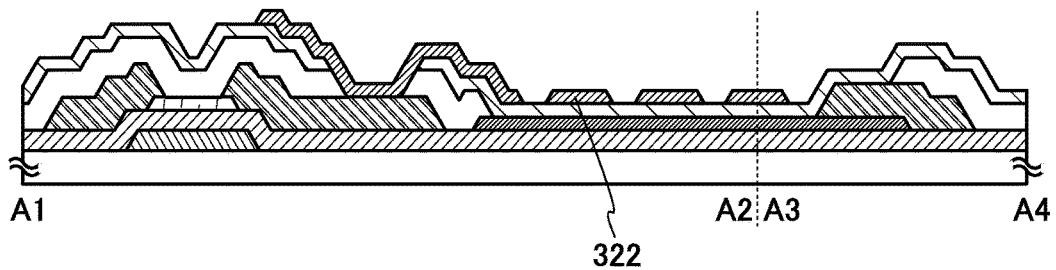

Next, as in FIG. 13C, the pixel electrode 322 is formed over the insulating film 321. The pixel electrode 322 is connected to the conductive film 312 through the opening 366.

The pixel electrode 322 is formed in such a manner that a transparent conductive film is formed over the insulating film 321 and processed by etching or the like.

For the pixel electrode 322, the material and formation method for the pixel electrode 322 described in Embodiment 1 can be referred to.

Next, an alignment film 324 (not illustrated) is formed over the insulating film 321 and the pixel electrode 322. The alignment film 324 can be formed by a rubbing method, an optical alignment method, or the like.

Through the above steps, the components formed over the substrate 302 can be formed.

For the liquid crystal element 111, the substrate 330 provided to face the substrate 302, and the like, the description in Embodiment 1 can be referred to.

The structures, the methods, and the like described in this embodiment can be combined as appropriate with any of the structures, the methods, and the like described in the other embodiments.

Embodiment 4

In this embodiment, examples of electronic devices including the liquid crystal display device of one embodiment of the present invention are described with reference to FIGS. 14A to 14E.

The liquid crystal display device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of the electronic devices to which the liquid crystal display device of one embodiment of the present invention can be applied include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. FIGS. 14A to 18F illustrate specific examples of these electronic devices.

Figure 14A:
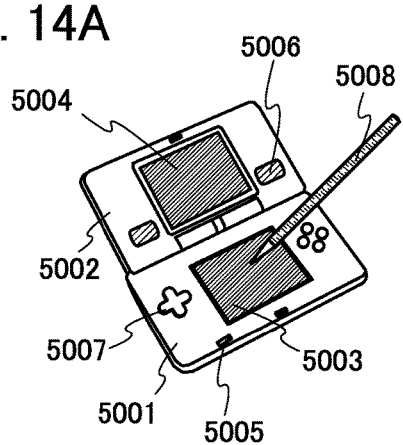
FIGS. 14A to 14F illustrate electronic devices for which a liquid crystal display device of one embodiment of the present invention can be used.

FIG. 14A illustrates a portable game machine, which includes a housing 5001, a housing 5002, a display portion 5003, a display portion 5004, a microphone 5005, speakers 5006, an operation key 5007, a stylus 5008, and the like. The liquid crystal display device of one embodiment of the present invention can be used for the display portion 5003 or the display portion 5004. Note that although the portable game machine in FIG. 14A has the two display portions 5003 and 5004, the number of display portions included in the portable game machine is not limited thereto.

Figure 14B:
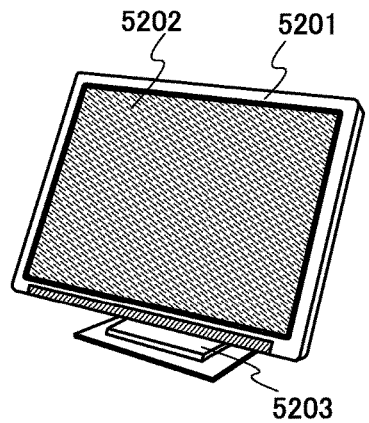

FIG. 14B illustrates a display device, which includes a housing 5201, a display portion 5202, a support 5203, and the like. The liquid crystal display device of one embodiment of the present invention can be used for the display portion 5202. Note that the display device means all display devices for displaying information, such as display devices for personal computers, for receiving TV broadcast, and for displaying advertisements.

Figure 14C:
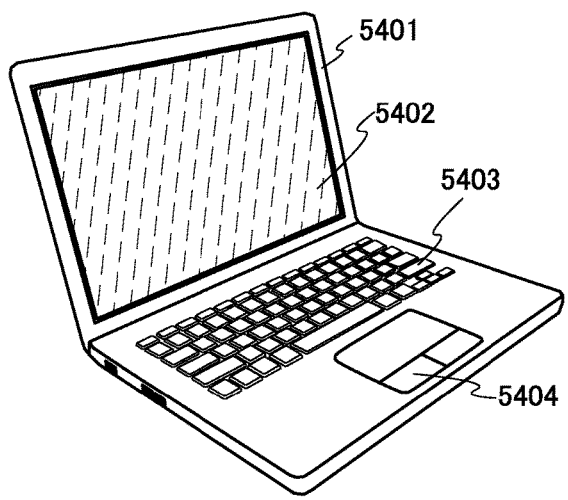

FIG. 14C illustrates a laptop personal computer, which includes a housing 5401, a display portion 5402, a keyboard 5403, a pointing device 5404, and the like. The liquid crystal display device of one embodiment of the present invention can be used for the display portion 5402.

Figure 14D:
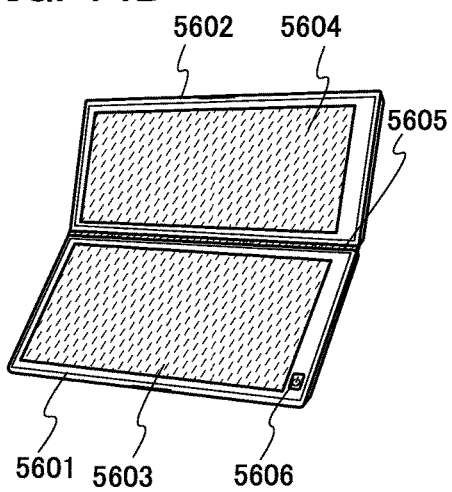

FIG. 14D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. The liquid crystal display device of one embodiment of the present invention can be used for the first display portion 5603 or the second display portion 5604. A liquid crystal display device with a position input function may be used as at least one of the first display portion 5603 and the second display portion 5604. Note that the position input function can be added by provision of a touch panel in a liquid crystal display device. Alternatively, the position input function can be added by provision of a photoelectric conversion element also called a photosensor in a pixel portion of a liquid crystal display device.

Figure 14E:
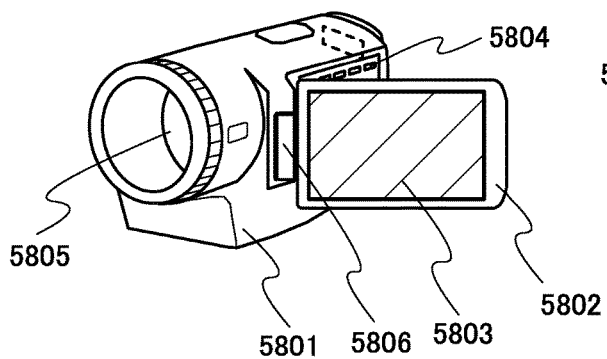

FIG. 14E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. An image on the display portion 5803 may be switched depending on the angle between the first housing 5801 and the second housing 5802 at the joint 5806. The liquid crystal display device of one embodiment of the present invention can be used for the display portion 5803.

Figure 14F:
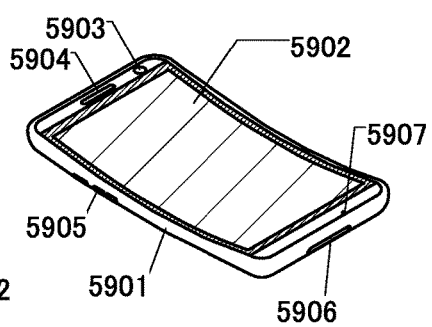

FIG. 14F illustrates a cellular phone. In the cellular phone, a display portion 5902, a microphone 5907, a speaker 5904, a camera 5903, an external connection portion 5906, and an operation button 5905 are provided in a housing 5901. The liquid crystal display device of one embodiment of the present invention can be used for a circuit included in the cellular phone. In the case where the liquid crystal display device of one embodiment of the present invention is formed over a flexible substrate, it can be applied to the display portion 5902 having a curved surface as shown in FIG. 14F.

The structures, the methods, and the like described in this embodiment can be combined as appropriate with any of the structures, the methods, and the like described in the other embodiments.

Example 1

In this example, the transmittance of the liquid crystal display device of one embodiment of the present invention was measured. The liquid crystal display devices used in this example are described below with reference to FIGS. 15A and 15B.

Figure 15A:
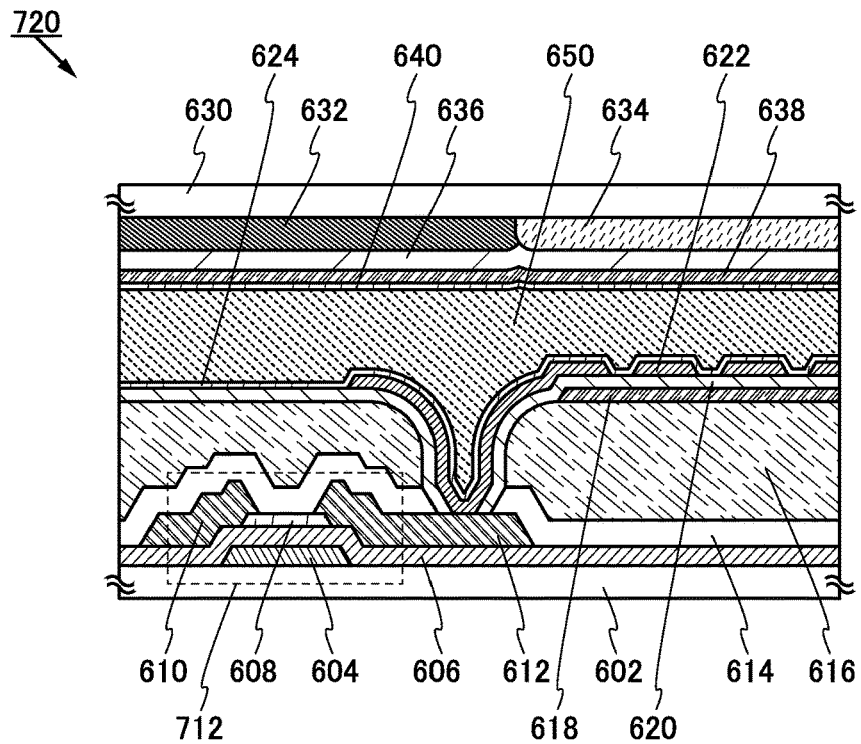
FIGS. 15A and 15B are cross-sectional views illustrating structures of samples of Example.

A liquid crystal display device 720 illustrated in FIG. 15A is an example of the liquid crystal display device of one embodiment of the present invention.

The liquid crystal display device 720 illustrated in FIG. 15A includes a substrate 602; a conductive film 604 serving as a gate of a transistor and being over the substrate 602; an insulating film 606 over the substrate 602 and the conductive film 604; an insulating film 606; an oxide semiconductor film 608 over the insulating film 606 in a region overlapping with the conductive film 604; conductive films 610 and 612 connected to the oxide semiconductor film 608; an insulating film 614 over the insulating film 606, the oxide semiconductor film 608, and the conductive films 610 and 612; an insulating film 616 over the insulating film 614; a first common electrode 618 over the insulating film 616; an insulating film 620 over the insulating film 614 and the first common electrode 618; a pixel electrode 622 over the insulating film 620; an alignment film 624 over the insulating film 620 and the pixel electrode 622; a liquid crystal layer 650 over the alignment film 624; an alignment film 640 over the liquid crystal layer 650; a second common electrode 638 over the alignment film 640; an insulating film 636 over the second common electrode 638; a light-blocking film 632 and a color film 634 over the insulating film 636; and a substrate 630 over the light-blocking film 632 and the color film 634.

A transistor 712 includes the conductive film 604, the insulating film 606, the oxide semiconductor film 608, and the conductive films 610 and 612. The conductive film 612 included in the transistor 712 is connected to the pixel electrode 622 through an opening formed in the insulating films 616 and 620.

Figure 15B:
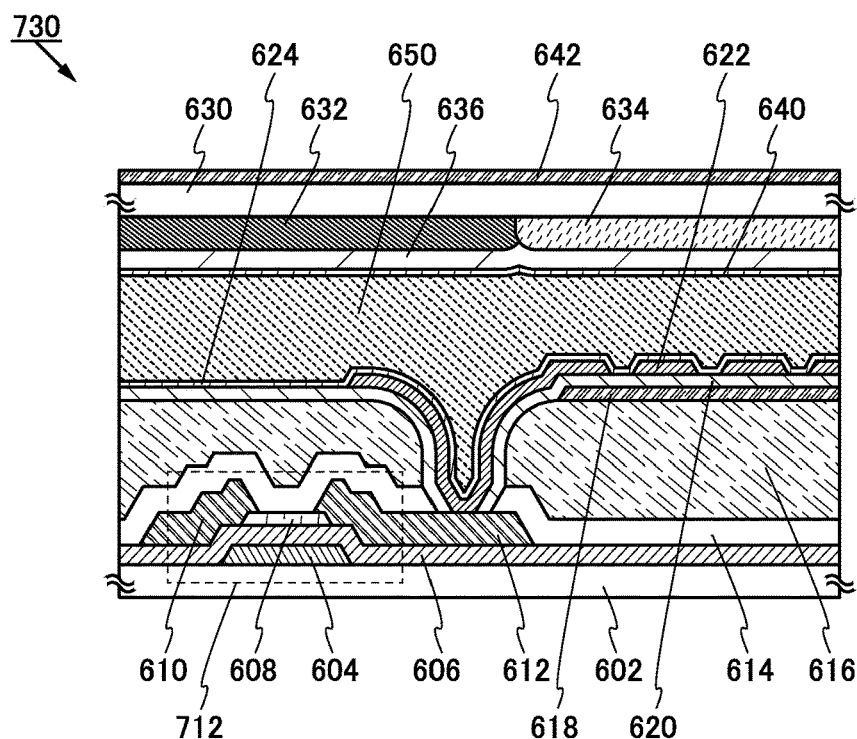

Next, a comparative liquid crystal display device 730 illustrated in FIG. 15B is described.

The comparative liquid crystal display device 730 illustrated in FIG. 15B includes a substrate 602; a conductive film 604 serving as a gate of a transistor and being over the substrate 602; an insulating film 606 over the substrate 602 and the conductive film 604; an insulating film 606; an oxide semiconductor film 608 over the insulating film 606 in a region overlapping with the conductive film 604; conductive films 610 and 612 connected to the oxide semiconductor film 608; an insulating film 614 over the insulating film 606, the oxide semiconductor film 608, and the conductive films 610 and 612; an insulating film 616 over the insulating film 614; a first common electrode 618 over the insulating film 616; an insulating film 620 over the insulating film 614 and the first common electrode 618; a pixel electrode 622 over the insulating film 620; an alignment film 624 over the insulating film 620 and the pixel electrode 622; a liquid crystal layer 650 over the alignment film 624; an alignment film 640 over the liquid crystal layer 650; an insulating film 636 over the alignment film 640; a light-blocking film 632 and a color film 634 over the insulating film 636; a substrate 630 over the light-blocking film 632 and the color film 634; and an electrode 642 over the substrate 630.

The transistor 712 includes the conductive film 604, the insulating film 606, the oxide semiconductor film 608, and the conductive films 610 and 612. The conductive film 612 included in the transistor 712 is connected to the pixel electrode 622 through an opening formed in the insulating films 616 and 620.

Differences between the liquid crystal display device 720 of one embodiment of the present invention illustrated in FIG. 15A and the comparative liquid crystal display device 730 illustrated in FIG. 15B are the second common electrode 638 and the electrode 642. Specifically, the second common electrode 638 is provided under the substrate 630 in the liquid crystal display device 720 whereas the electrode 642 is provided over the substrate 630 in the comparative liquid crystal display device 730.

In the structure illustrated in FIG. 15A, voltage can be applied to the liquid crystal layer 650 through the alignment film 640 by the second common electrode 638. In contrast, in the structure illustrated in FIG. 15B, since the electrode 642 is provided over the substrate 630, it is difficult to apply voltage to the liquid crystal layer 650 by the electrode 642.

Methods for manufacturing the liquid crystal display devices 720 and 730 illustrated in FIGS. 15A and 15B are described below. The liquid crystal display device 720 and the comparative liquid crystal display device 730 have the same structure except for the second common electrode 638 and the electrode 642. First, steps for forming the common components are described below.

A glass substrate was used as the substrate 602. The conductive film 604 was formed over the substrate 602. A 200-nm-thick tungsten film was formed by a sputtering method as the conductive film 604. Then, the insulating film 606 was formed over the substrate 602 and the conductive film 604. A 400-nm-thick silicon nitride film and a 50-nm-thick silicon oxynitride film were stacked as the insulating film 606.

Note that the silicon nitride film was formed to have a three-layer structure of a first silicon nitride film, a second silicon nitride film, and a third silicon nitride film.

The first silicon nitride film was formed to a thickness of 50 nm under the following conditions: silane with a flow rate of 200 sccm, nitrogen with a flow rate of 2000 sccm, and ammonia with a flow rate of 100 sccm were supplied to a treatment chamber of a plasma CVD apparatus as a source gas; the pressure in the treatment chamber was adjusted to 100 Pa; and a power of 2000 W was supplied with the use of a 27.12 MHz high-frequency power source. The second silicon nitride film was formed to a thickness of 300 nm under the following conditions: silane with a flow rate of 200 sccm, nitrogen with a flow rate of 2000 sccm, and ammonia with a flow rate of 2000 sccm were supplied to a treatment chamber of a plasma CVD apparatus as a source gas; the pressure in the treatment chamber was adjusted to 100 Pa; and a power of 2000 W was supplied with the use of a 27.12 MHz high-frequency power source. The third silicon nitride film was formed to a thickness of 50 nm under the following conditions: silane with a flow rate of 200 sccm and nitrogen with a flow rate of 5000 sccm were supplied to a treatment chamber of a plasma CVD apparatus as a source gas; the pressure in the treatment chamber was adjusted to 100 Pa; and a power of 2000 W was supplied with the use of a 27.12 MHz high-frequency power source. The substrate temperature during the formation of the first silicon nitride film, the second silicon nitride film, and the third silicon nitride film was set to 350° C.

The silicon oxynitride film was formed under the following conditions: silane with a flow rate of 20 sccm and dinitrogen monoxide with a flow rate of 3000 sccm were supplied to a treatment chamber of a plasma CVD apparatus as a source gas; the pressure in the treatment chamber was adjusted to 40 Pa; and a power of 100 W was supplied with the use of a 27.12 MHz high-frequency power source. The substrate temperature during the formation of the silicon oxynitride film was set to 350° C.

Next, the oxide semiconductor film 608 was formed over the insulating film 606 in a region overlapping with the conductive film 604. Here, a 35-nm-thick oxide semiconductor film was formed over the insulating film 614 by a sputtering method.

The oxide semiconductor film was formed under the following conditions: a sputtering target of In:Ga:Zn=1:1:1 (atomic ratio) was used; oxygen with a flow rate of 30 sccm and argon with a flow rate of 270 sccm were supplied as a sputtering gas into a treatment chamber of a sputtering apparatus; the pressure in the treatment chamber was adjusted to 0.6 Pa; and a direct-current power of 5 kW was supplied. The substrate temperature during the formation of the oxide semiconductor film was set to 170° C.

Then, the conductive films 610 and 612 in contact with the oxide semiconductor film 608 were formed.

As the conductive films 610 and 612, a 400-nm-thick aluminum film was formed over a 50-nm-thick tungsten film, and a 100-nm-thick titanium film was formed over the aluminum film.

Next, after the substrate was transferred to a treatment chamber in a reduced pressure and heated at 350° C., the oxide semiconductor film 608 was exposed to oxygen plasma that was generated in a dinitrogen monoxide atmosphere by supply of a high-frequency power of 150 W to an upper electrode provided in the treatment chamber with the use of a 27.12 MHz high-frequency power source.

Next, the insulating film 614 was formed over the oxide semiconductor film 608 and the conductive films 610 and 612. Here, the insulating film 614 was formed to have a three-layer structure of a first oxide insulating film, a second oxide insulating film, and a nitride insulating film.

First, after the above plasma treatment, the first oxide insulating film and the second oxide insulating film were formed in succession without exposure to the air. A 50-nm-thick silicon oxynitride film was formed as the first oxide insulating film, and a 400-nm-thick silicon oxynitride film was formed as the second oxide insulating film.

The first oxide insulating film was formed by a plasma CVD method under the following conditions: silane with a flow rate of 20 sccm and dinitrogen monoxide with a flow rate of 3000 sccm were used as a source gas; the pressure in the treatment chamber was 200 Pa; the substrate temperature was 350° C.; and a high-frequency power of 100 W was supplied to parallel-plate electrodes.

The second oxide insulating film was formed by a plasma CVD method under the following conditions: silane with a flow rate of 160 sccm and dinitrogen monoxide with a flow rate of 4000 sccm were used as a source gas; the pressure in the treatment chamber was 200 Pa; the substrate temperature was 220° C.; and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, by heat treatment, water, nitrogen, hydrogen, and the like were released from the first oxide insulating film and the second oxide insulating film and part of oxygen contained in the second oxide insulating film was supplied to the oxide semiconductor film 608. Here, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method under the following conditions: silane with a flow rate of 50 sccm, nitrogen with a flow rate of 5000 sccm, and ammonia with a flow rate of 100 sccm were used as a source gas; the pressure in the treatment chamber was 100 Pa; the substrate temperature was 350° C.; and a high-frequency power of 1000 W was supplied to parallel plate electrodes.

Next, an opening reaching the conductive film 612 was formed in the insulating film 614. The opening was formed by a dry etching method.

The insulating film 616 having an opening was formed over the insulating film 614. An acrylic resin, which is an organic resin material, was used for the insulating film 616. The thickness of the acrylic resin film was set to 2 μm.

The first common electrode 618 was formed over the insulating film 616. As the first common electrode 618, a 100-nm-thick conductive film of an indium oxide-tin oxide compound ($ITO-SiO_2$) was formed by a sputtering method. Note that the composition of a target used for forming the conductive film was $In_2O_3:SnO_2:SiO_2=85:10:5$ [wt %].

Then, the insulating film 620 was formed over the insulating film 616 and the first common electrode 618. A 300-nm-thick nitride insulating film was formed as the insulating film 620. The nitride insulating film was formed by a plasma CVD method under the following conditions: silane with a flow rate of 50 sccm, nitrogen with a flow rate of 5000 sccm, and ammonia with a flow rate of 100 sccm were used as a source gas; the pressure in the treatment chamber was 200 Pa; the substrate temperature was 220° C.; and a high-frequency power of 1000 W was supplied to parallel plate electrodes.

Subsequently, the pixel electrode 622 was formed over the insulating film 620. As the pixel electrode 622, a 80-nm-thick conductive film of an indium oxide-tin oxide compound (ITO—$SiO_2$) was formed by a sputtering method. Note that the composition of a target used for forming the conductive film was the same as the composition of a target used for forming the first common electrode 618. After that, heat treatment was performed in a nitrogen atmosphere at 250° C. for one hour.

Next, the alignment film 624 was formed over the insulating film 620 and the pixel electrode 622. A 60-nm-thick polyimide film was used as the alignment film 624. Note that the resistivity of the polyimide film used as the alignment film 624 was $4.0 \times 10^{15}$ Ω·cm.

Through the above steps, the components over the substrate 602 were formed.

Next, a method for forming components on the substrate 630 provided to face the substrate 602 is described. Note that the liquid crystal display device 720 illustrated in FIG. 15A is different from the comparative liquid crystal display device 730 illustrated in FIG. 15B in the components on the substrate 630. Therefore, methods for manufacturing the liquid crystal display devices 720 and 730 are separately described below. Hereinafter, the liquid crystal display device 720 is referred to as Sample 1 and the comparative liquid crystal display device 730 is referred to as Comparative Sample 2.

<Method for Manufacturing Components on the Substrate 630 illustrated in FIG. 15A>

A glass substrate was used as the substrate 630. The light-blocking film 632 was formed in a desired region to be in contact with the substrate 630. As the light-blocking film 632, a 600-nm-thick organic resin film containing black pigment was formed by a spin coating method.

Next, the color film 634 was formed in contact with the substrate 630. As the color film 634, a 1.4-μm-thick organic resin film containing pigment was formed by a spin coating method.

Then, the insulating film 636 was formed in contact with the light-blocking film 632 and the color film 634. A 1.5-μm-thick acrylic resin film was used as the insulating film 636.

Subsequently, the second common electrode 638 was formed in contact with the insulating film 636. As the second common electrode 638, a 100-nm-thick conductive film of an indium oxide-tin oxide compound (ITO—$SiO_2$) was formed by a sputtering method. Note that the composition of a target used for forming the conductive film was the same as the composition of a target used for forming the first common electrode 618.

Then, the alignment film 640 was formed in contact with the second common electrode 638. The alignment film 640 was formed using the same material as the alignment film 624.

Next, the substrate 630 and the substrate 602 were bonded to each other, and a liquid crystal material forming the liquid crystal layer 650 was injected between the substrates by a one drop filling method.

The liquid crystal layer 650 was formed using a negative liquid crystal material (MLC-3006 produced by Merck) such that the cell gap (the distance between the alignment film 624 and the alignment film 640) was set to 3.5 μm.

Through the above steps, Sample 1, which is the liquid crystal display device of one embodiment of the present invention illustrated in FIG. 15A, was manufactured.

<Method for Manufacturing Components on the Substrate 630 illustrated in FIG. 15B>

A glass substrate was used as the substrate 630. The light-blocking film 632 was formed in a desired region to be in contact with the substrate 630. As the light-blocking film 632, a 600-nm-thick organic resin film containing black pigment was formed by a spin coating method.

Next, the color film 634 was formed in contact with the substrate 630. As the color film 634, a 1.4-μm-thick organic resin film containing pigment was formed by a spin coating method.

Then, the insulating film 636 was formed in contact with the light-blocking film 632 and the color film 634. A 1.5-μm-thick acrylic resin film was used as the insulating film 636.

Subsequently, the electrode 642 was formed in contact with a surface of the substrate 630 where the insulating film 636 was not provided. As the electrode 642, a 100-nm-thick conductive film of an indium oxide-tin oxide compound (ITO—$SiO_2$) was formed by a sputtering method. Note that the composition of a target used for forming the conductive film was the same as the composition of a target used for forming the first common electrode 618.

Then, the alignment film 640 was formed in contact with the insulating film 636. The alignment film 640 was formed using the same material as the alignment film 624.

Next, the substrate 630 and the substrate 602 were bonded to each other, and a liquid crystal material forming the liquid crystal layer 650 was injected between the substrates by a one drop filling method.

The liquid crystal layer 650 was formed using a negative liquid crystal material (MLC-3006 produced by Merck) such that the cell gap (the distance between the alignment film 624 and the alignment film 640) was set to 3.5 μm.

Through the above steps, Comparative Sample 2, which is the comparative liquid crystal display device illustrated in FIG. 15B, was manufactured.

Next, the transmittances of Sample 1 and Comparative Sample 2 were measured. In measuring the transmittance of Sample 1, voltages of 0 V, 5.5 V, and 0.8 V were applied to the first common electrode 618, the pixel electrode 622, and the second common electrode 638, respectively. The voltage application to the pixel electrode 622, the second common electrode 638, and the second common electrode 638 was performed intermittently, and data writing was performed every time voltage was applied. In measuring the transmittance of Comparative Sample 2, voltages of 0 V, 5.5 V, and 0.8 V were applied to the first common electrode 618, the pixel electrode 622, and the electrode 642, respectively. The voltage application to the pixel electrode 622, the second common electrode 638, and the electrode 642 was performed intermittently and data writing was performed every time voltage was applied. Note that data writing in Sample 1 and Comparative Sample 2 was controlled by the transistor 712 formed in Sample 1 and Comparative Sample 2.

Figure 21A:
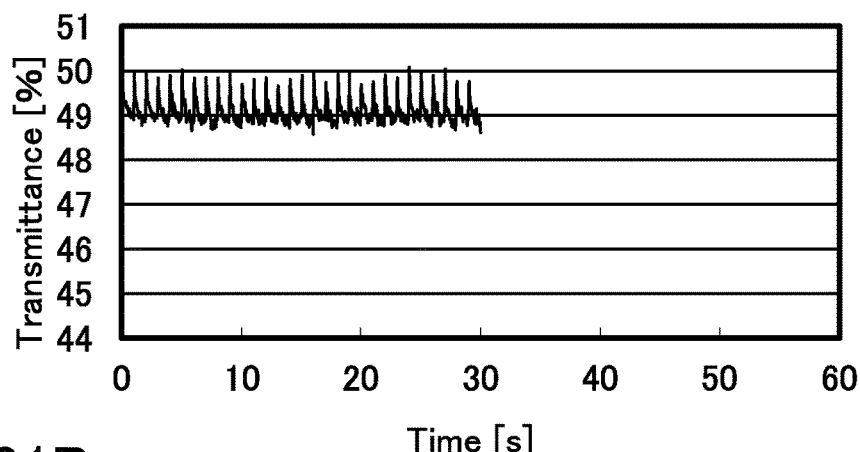
FIGS. 21A to 21C are graphs each showing the transmittance of a sample of Example.
Figure 21B:
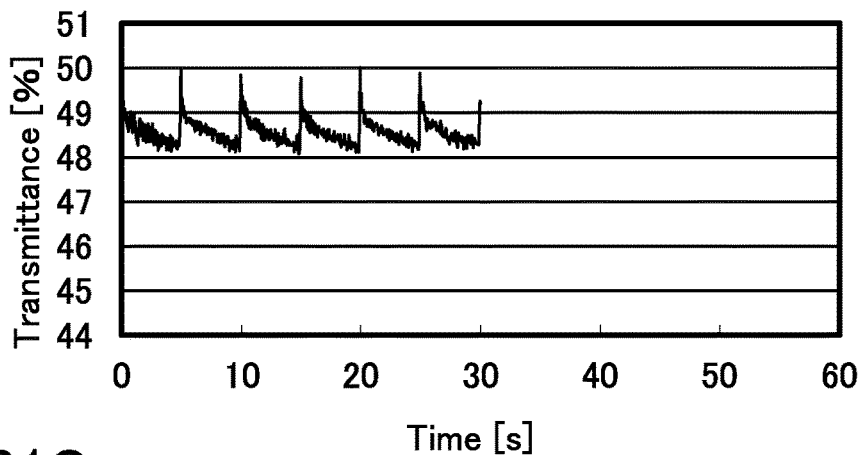
Figure 21C:
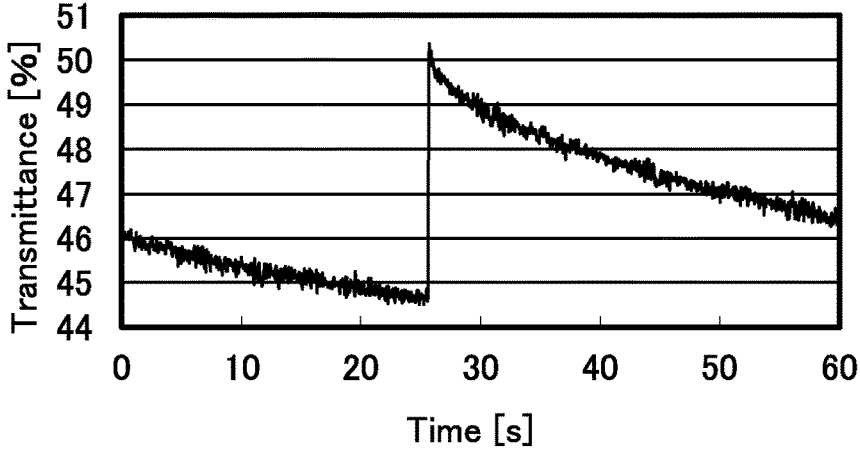

FIGS. 16A and 16B, FIGS. 17A and 17B, FIGS. 18A and 18B, FIGS. 19A and 19B, and FIGS. 20A and 20B show transmittance-time characteristics of Sample 1 and Comparative Sample 2. In these drawings, the horizontal axis represents time (s) and the vertical axis represents transmittance (%). FIGS. 16A and 16B, FIGS. 17A and 17B, FIGS. 18A and 18B, FIGS. 19A and 19B, and FIGS. 20A and 20B show transmittance-time characteristics at the maximum gray level (at a transmittance of 100%). FIGS. 21A to 21C show transmittance-time characteristics of Sample 1. In FIGS. 21A to 21C, the horizontal axis represents time (s) and the vertical axis represents transmittance (%). FIGS. 21A to 21C show transmittance-time characteristics at an intermediate gray level (at a transmittance of 50%). Note that the transmittance-time characteristics at the intermediate gray level may be different from the transmittance-time characteristics at the maximum gray level.

The transmittance-time characteristics shown in FIG. 16A, FIG. 17A, FIG. 18A, FIG. 19A, and FIG. 20A are the results of Sample 1 of one embodiment of the present invention; the transmittance-time characteristics shown in FIG. 16B, FIG. 17B, FIG. 18B, FIG. 19B, and FIG. 20B are the results of Comparative Sample 2.

Figure 16A:
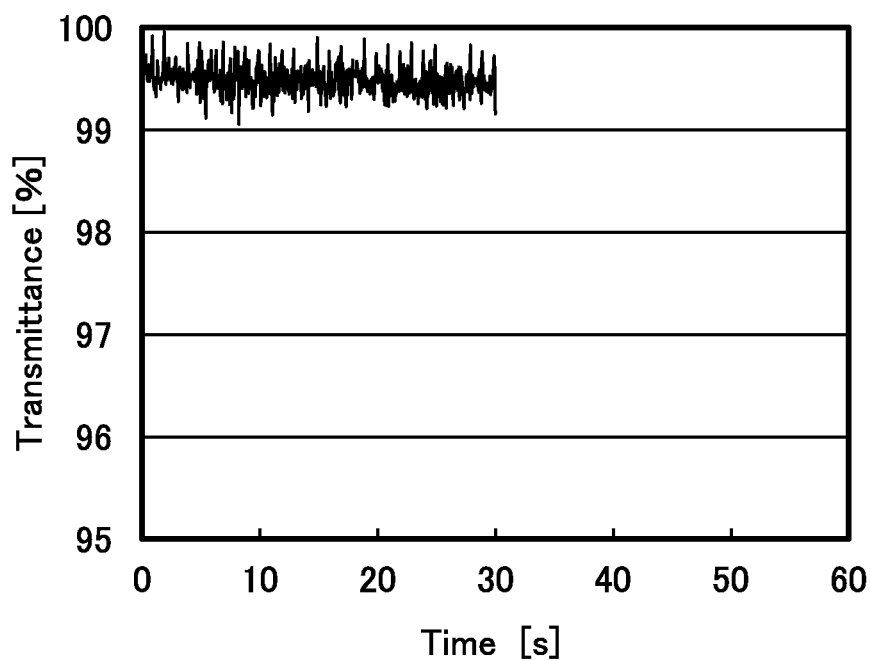
FIGS. 16A and 16B are graphs each showing the transmittance of a sample of Example.
Figure 16B:
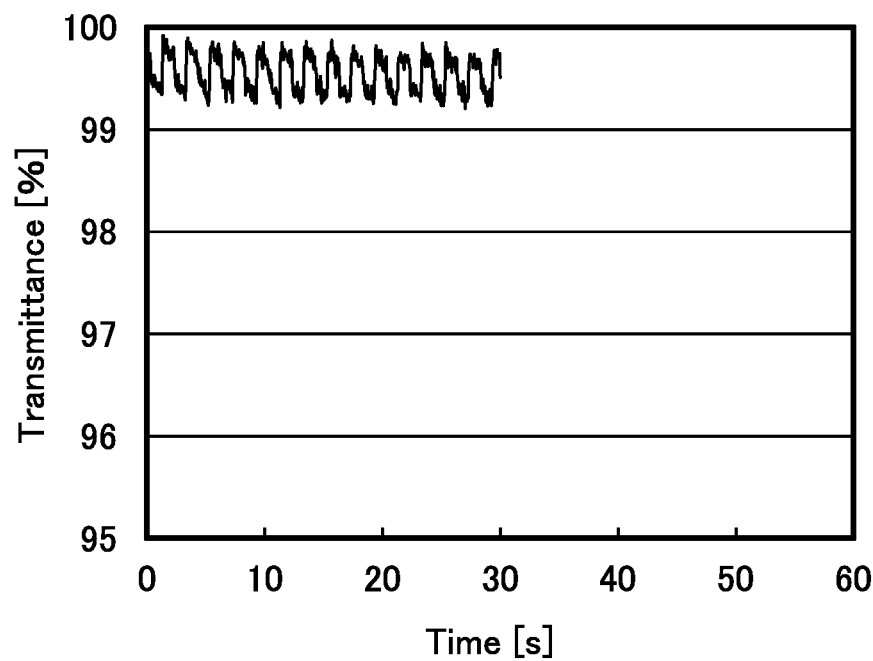
Figure 17A:
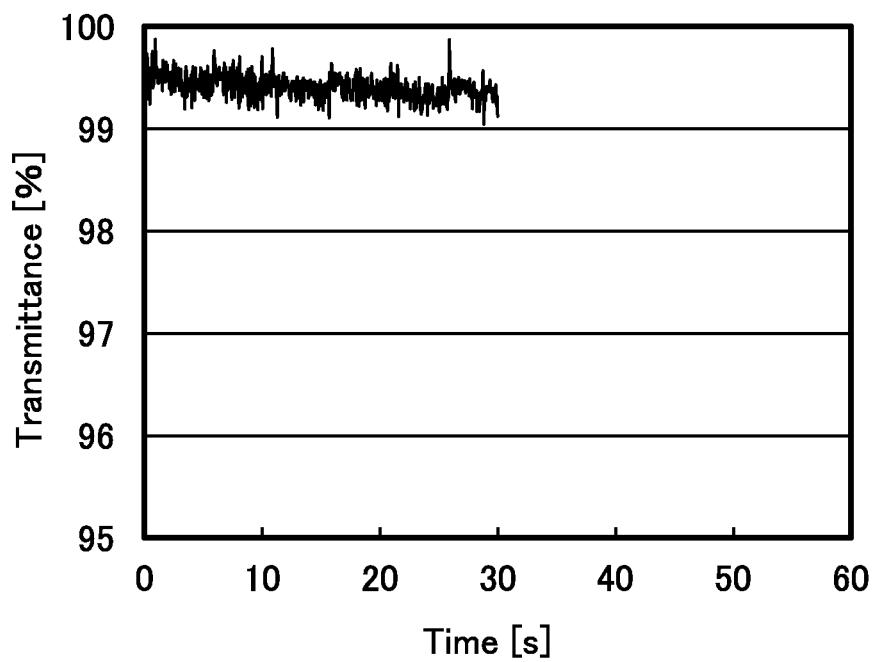
FIGS. 17A and 17B are graphs each showing the transmittance of a sample of Example.
Figure 17B:
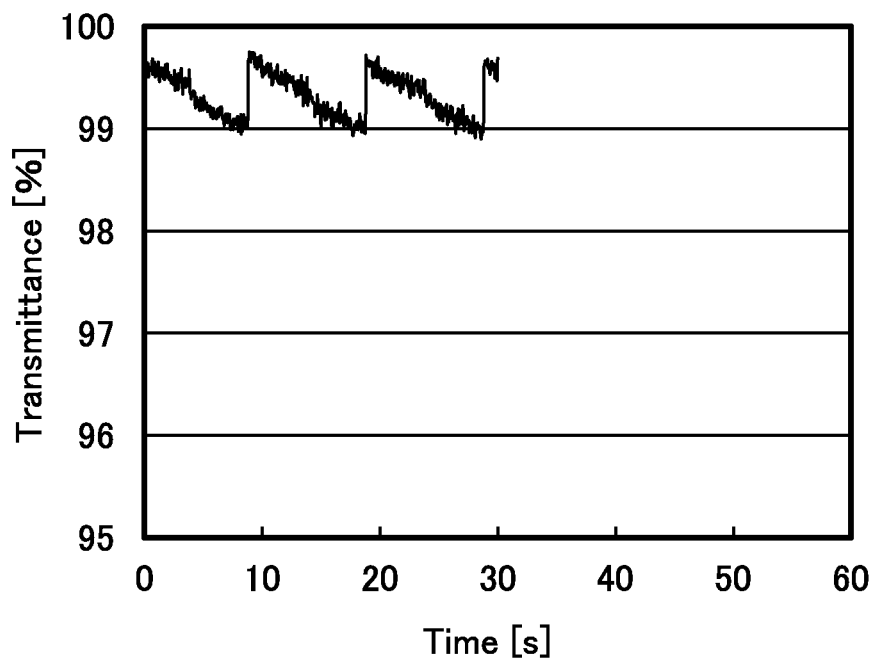
Figure 18A:
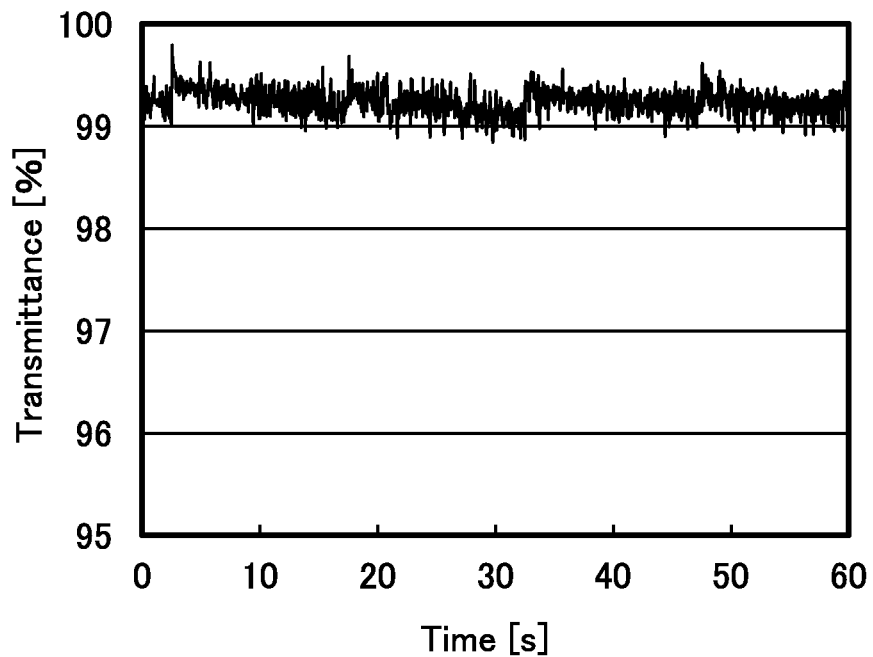
FIGS. 18A and 18B are graphs each showing the transmittance of a sample of Example.
Figure 18B:
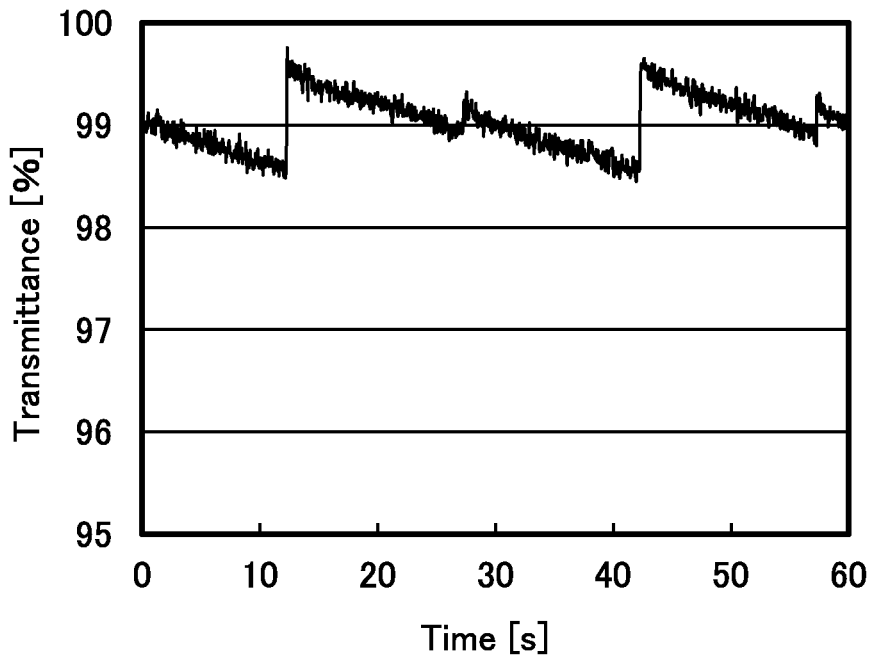
Figure 19A:
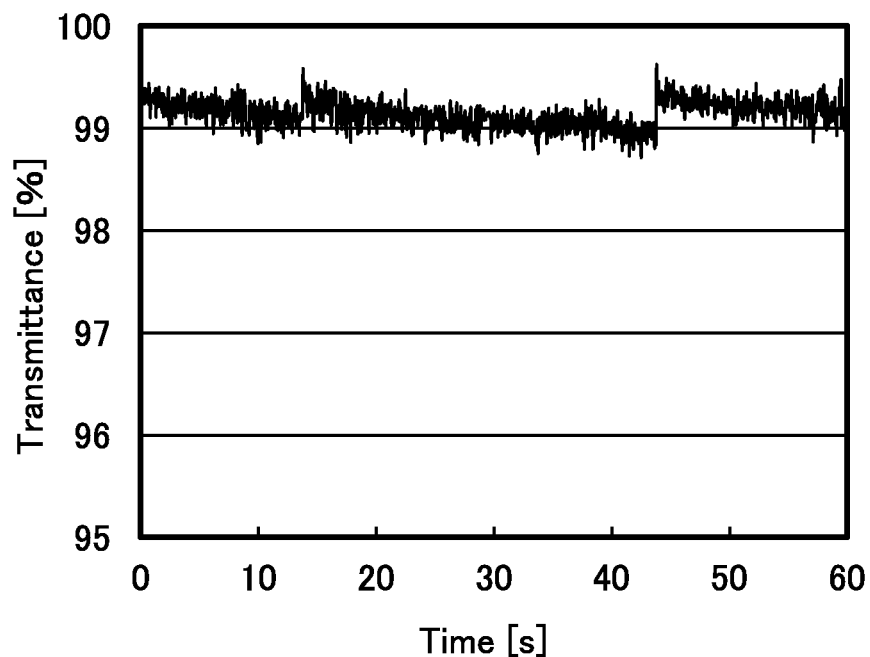
FIGS. 19A and 19B are graphs each showing the transmittance of a sample of Example.
Figure 19B:
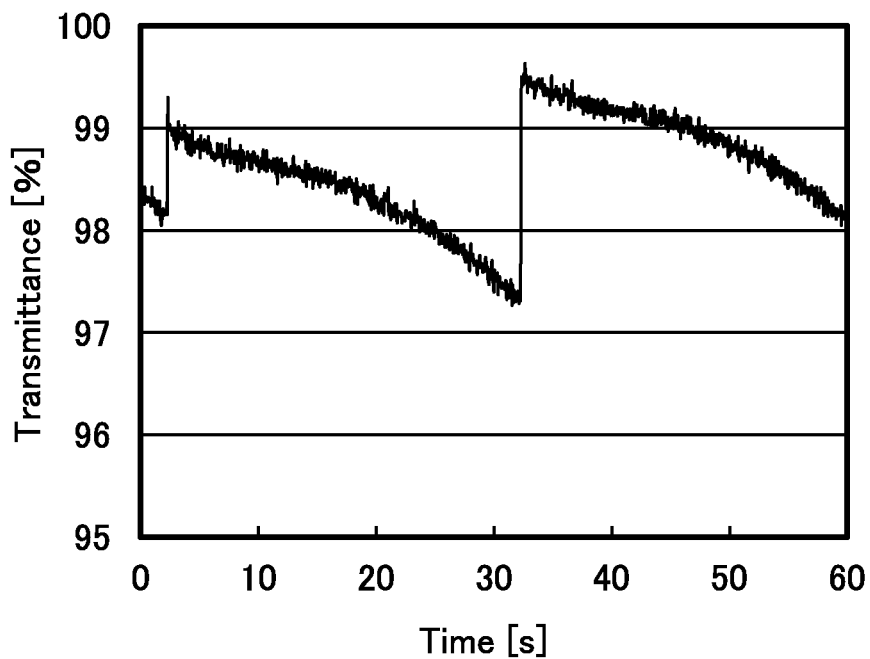
Figure 20A:
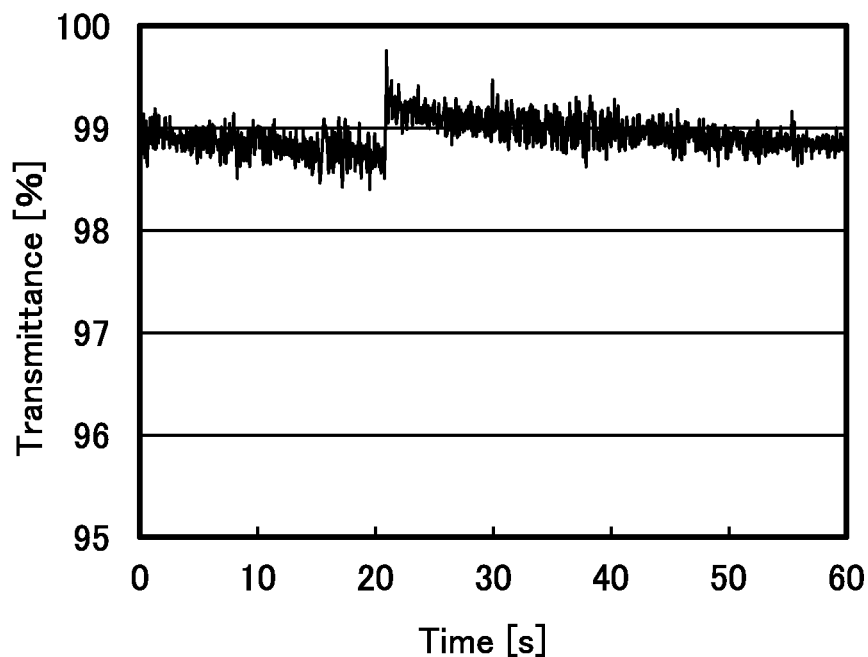
FIGS. 20A and 20B are graphs each showing the transmittance of a sample of Example.
Figure 20B:
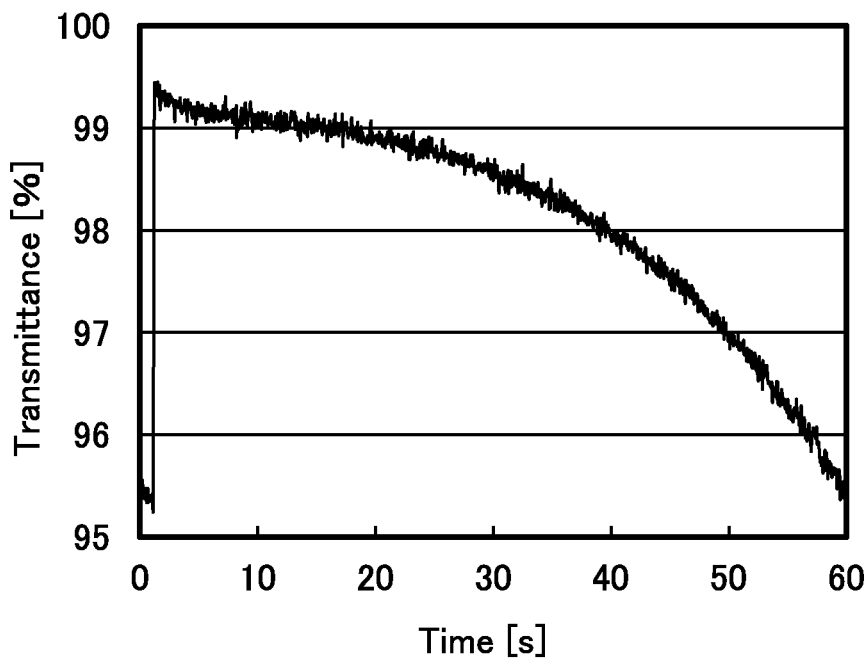

FIGS. 16A and 16B show the transmittance-time characteristics in the case where data writing is performed once every second; FIGS. 17A and 17B, data writing is performed once every 5 seconds; FIGS. 18A and 18B, once every 15 seconds; FIGS. 19A and 19B, once every 30 seconds; and FIGS. 20A and 20B, once every 60 seconds. Note that timings for data writing operations are different between the graphs with the same interval between data writing operations. Therefore, time for data writing operation is not the same between FIGS. 16A and 16B, between FIGS. 17A and 17B, between FIGS. 18A and 18B, between FIGS. 19A and 19B, and between FIGS. 20A and 20B.

FIG. 21A shows the transmittance-time characteristics in the case where data writing is performed once every second; FIG. 21B, once every 5 seconds; and FIG. 21C, once every 60 seconds.

The results shown in FIGS. 16A and 16B, FIGS. 17A and 17B, FIGS. 18A and 18B, FIGS. 19A and 19B, and FIGS. 20A and 20B indicate that Sample 1 of one embodiment of the present invention has a small time-dependent change in transmittance whereas Comparative Sample 2 has a large time-dependent change in transmittance. In particular, in the case where the time interval between data writing operations is long for example, in the case of FIG. 20B where data writing is performed once every 60 seconds, the coefficient of transmittance fluctuation is greater than or equal to 3%. This result indicates that in Sample 1 of one embodiment of the present invention, change in transmittance of the liquid crystal layer 650 can be made small by application of voltage to the second common electrode 638. In contrast, in Comparative Sample 2, the second common electrode 638 is not provided, and a potential having the same level as a potential applied to the second common electrode 638 in Sample 1 is applied to the electrode 642 over the substrate 630. Since the electrode 642 does not supply potential to the liquid crystal layer 650, change in transmittance in the liquid crystal layer 650 cannot be small.

The results shown in FIGS. 21A to 21C indicate that, in Sample 1 of one embodiment of the present invention, the coefficient of transmittance fluctuation is approximately 2% in the case where data writing is performed once every 5 seconds. This fluctuation might be perceived as a flicker depending on a display image; therefore, the time interval between data writing operations is preferably shorter than 5 seconds.

Example 2

In this example, the transmittance of the liquid crystal display device of one embodiment of the present invention was calculated. The structures of the liquid crystal display devices used for the calculation in this example are described below with reference to FIGS. 22A and 22B.

Figure 22A:
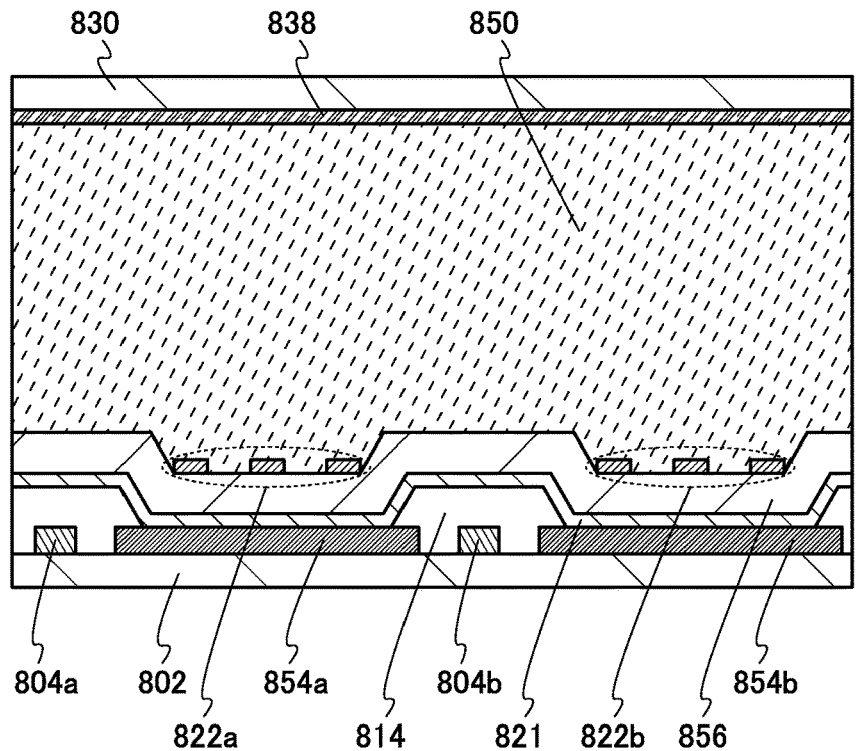
FIGS. 22A and 22B are cross-sectional views each illustrating a structure of a liquid crystal display device used for calculation in Example.

The liquid crystal display device that is used for calculation and illustrated in FIG. 22A includes a substrate 802; electrodes 804a, 804b, 854a, and 854b over the substrate 802; an insulating film 814 covering the electrodes 804a and 804b and end portions of the electrodes 854a and 854b; an insulating film 821 over the insulating film 814 and the electrodes 854a and 854b; an insulating film 856 over the insulating film 821; a pixel electrode 822a over the insulating films 821 and 856 in a region overlapping with the electrode 854a; a pixel electrode 822b over the insulating films 821 and 856 in a region overlapping with the electrode 854b; a liquid crystal layer 850 over the insulating film 856 and the pixel electrodes 822a and 822b; an electrode 838 over the liquid crystal layer 850; and a substrate 830 over the electrode 838.

For convenience of calculation, the liquid crystal display device for calculation illustrated in FIG. 22A has a structure obtained by simplifying the structure of the pixel in the liquid crystal display device of one embodiment of the present invention illustrated in FIG. 10 and FIG. 11. Specifically, the substrate 802 in FIG. 22A corresponds to the substrate 302 in FIG. 11; the electrodes 804a and 804b, the conductive film 304; the electrodes 854a and 854b, the electrode 354; the insulating film 814, the insulating film 314; the insulating film 821, the insulating film 321; the pixel electrodes 822a and 822b, the pixel electrode 322; the liquid crystal layer 850, the liquid crystal layer 350; the electrode 838, the second common electrode 338; and the substrate 830, the substrate 330. Note that the insulating film 856 in FIG. 22A is not illustrated in FIG. 11.

Figure 22B:
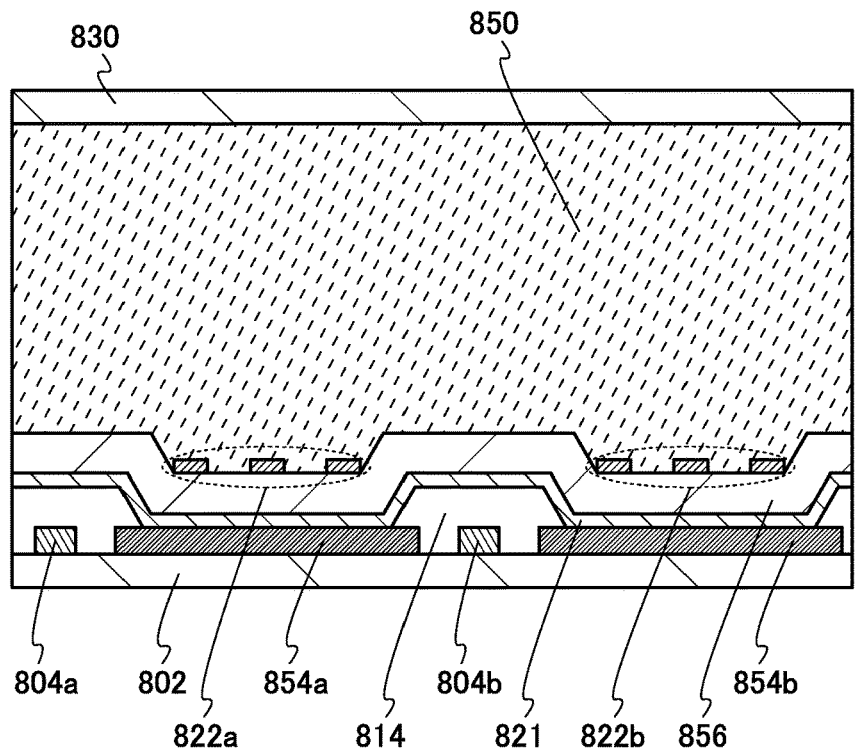

A liquid crystal display device that is used for calculation and illustrated in FIG. 22B has the same structure as the liquid crystal display device illustrated in FIG. 22A except that the electrode 838 over the liquid crystal layer 850 is not provided.

FIG. 22A and FIG. 22B each illustrate a cross-sectional structure of two pixels in the liquid crystal display device. The left side of the drawing, specifically, the region including the electrode 804a, the electrode 854a, and the pixel electrode 822a corresponds to one pixel, and the right side, specifically, the region including the electrode 804b, the electrode 854b, and the pixel electrode 822b corresponds to the other pixel. In FIGS. 22A and 22B, each of the pixel electrodes 822a and 822b corresponds to separated three electrodes.

The liquid crystal display device for calculation illustrated in FIG. 22A is referred to as Sample 3. The liquid crystal display device for calculation illustrated in FIG. 22B is referred to as Comparative Sample 4. Sample 3 has a structure of the liquid crystal display device of one embodiment of the present invention. Comparative Sample 4 has a structure of the comparative liquid crystal display device.

In FIGS. 22A and 22B, each of the electrodes 804a and 804b has a thickness of 200 nm and a width of 2 μm; each of the electrodes 854a and 854b has a thickness of 200 nm and a width of 20 µm; the insulating film 814 has a thickness of 500 nm; the insulating film 821 has a thickness of 100 nm; the insulating film 856 has a thickness of 400 nm; each of the pixel electrodes 822a and 822b has a thickness of 100 nm and a width of 2 µm; the liquid crystal layer 850 has a thickness of 4 µm; and the negative liquid crystal material (MLC-3006 produced by Merck) was used. In FIG. 22A, the electrode 838 has a thickness of 100 nm.

In the liquid crystal display device for calculation illustrated in FIG. 22A, the transmittance of the liquid crystal layer 850 was calculated in the case where 0 V was applied to the electrode 804a; 6 V, the electrode 804b; 0 V, the electrodes 854a and 854b; 0 V, the pixel electrode 822a; 6 V, the pixel electrode 822b; and 0 V, the electrode 838.

In the liquid crystal display device for calculation illustrated in FIG. 22B, the transmittance of the liquid crystal layer 850 was calculated in the case where 0 V was applied to the electrode 804a; 6 V, the electrode 804b; 0 V, the electrodes 854a and 854b; 0 V, the pixel electrode 822a; and 6 V, the pixel electrode 822b. Note that voltages applied to these electrodes were set on the assumption that black display is performed on the left pixel and white display is performed on the right pixel in FIGS. 22A and 22B.

Figure 23:
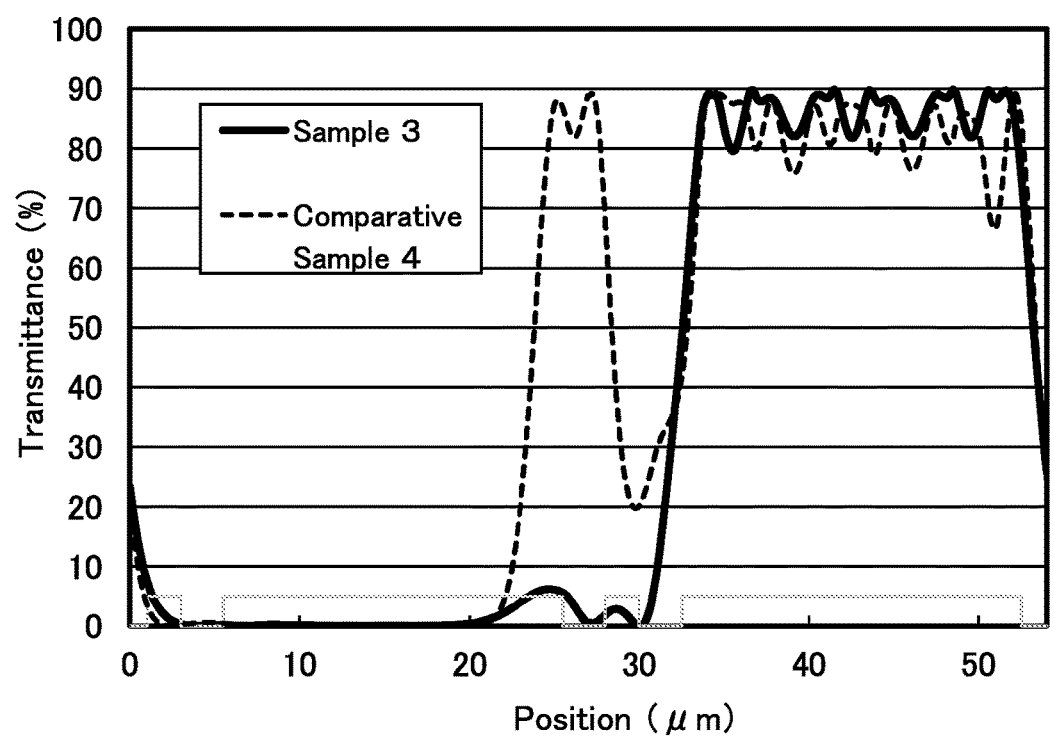
FIG. 23 is a graph showing the results of calculating transmittances of samples in Example.

FIG. 23 shows the results of calculating the transmittances. The calculation was performed using calculation software, LCD Master (produced by SHINTECH, Inc.).

In FIG. 23, the horizontal axis represents position (µm); the vertical axis represents transmittance (%); the solid line represents Sample 3; and the dashed line represents Comparative Sample 4. In FIG. 23, the shapes of the electrodes 804a, 804b, 854a, and 854b illustrated in FIGS. 22A and 22B are schematically shown by the gray solid line to show the positions of the electrodes 804a, 804b, 854a, and 854b.

From the calculation results shown in FIG. 23, it is found that Sample 3 of one embodiment of the present invention has low transmittance in the position near 20 µm to 30 µm. In contrast, Comparative Sample 4 has high transmittance in the position near 20 µm to 30 µm. This is because Sample 3 includes the electrode 838 over the liquid crystal layer 850 whereas Comparative Sample 4 does not, and voltage applied to the electrode 838 (in this example, 0 V) prevents transmittance in the position near 20 µm to 30 µm from increasing in Sample 3. Furthermore, Sample 3 has higher transmittance in the position near 40 µm to 50 µm than Comparative Sample 4. In FIG. 23, in the left pixel in the position 0 µm to 25 µm, voltage applied to the electrodes 804b and 854b is 0 V; thus, black display, that is, low transmittance is preferred. In the right pixel in the position 26 µm to 55 µm, voltage applied to the electrodes 804b and 854b is 6 V; thus, white display, that is, high transmittance is preferred. The calculation results confirm that Sample 3 of one embodiment of the present invention has excellent transmittance characteristics as compared with Comparative Sample 4 because Sample 3 includes the electrode 838 over the liquid crystal layer 850.

As described above, the liquid crystal display device of one embodiment of the present invention can have high black and white contrast between adjacent pixels.

The structure described in this example can be combined as appropriate with any of the structures described in the embodiments or the other examples.

This application is based on Japanese Patent Application serial no. 2013-106681 filed with Japan Patent Office on May 21, 2013; Japanese Patent Application serial no. 2013-126895 filed with Japan Patent Office on Jun. 17, 2013; and Japanese Patent Application serial no. 2013-153362 filed with Japan Patent Office on Jul. 24, 2013, the entire contents of which are hereby incorporated by reference.

What is claimed is:

1. A liquid crystal display device comprising:
    a first substrate comprising:
        a transistor comprising a crystalline oxide semiconductor film in a channel formation region;
        a pixel electrode electrically connected to one of a source electrode and a drain electrode of the transistor;
        an insulating layer in contact with the pixel electrode; and
        a first common electrode in contact with the insulating layer,
    a second substrate facing the first substrate, the second substrate comprising a second common electrode; and
    a liquid crystal layer comprising a liquid crystal material between the first substrate and the second substrate,
    wherein a potential difference between the first common electrode and the second common electrode is smaller than a potential difference between the second common electrode and the pixel electrode,
    wherein the potential difference between the second common electrode and the pixel electrode is smaller than a potential difference between the first common electrode and the pixel electrode, and
    wherein a specific resistivity of the liquid crystal material is greater than or equal to $1.8 \times 10^{13}$ Ω·cm and less than or equal to $1.0 \times 10^{16}$ Ω·cm.

2. The liquid crystal display device according to claim 1, wherein the crystalline oxide semiconductor film comprises In, Ga, and Zn.

3. The liquid crystal display device according to claim 1, further comprising a planarization film between the first substrate and the pixel electrode.

4. The liquid crystal display device according to claim 1, further comprising a color film between the second substrate and the second common electrode.

5. The liquid crystal display device according to claim 1, wherein c-axes of the crystalline oxide semiconductor film are aligned in a direction perpendicular to a top surface of the crystalline oxide semiconductor film.

6. A liquid crystal display device comprising:
    a first substrate comprising:
        a transistor comprising a crystalline oxide semiconductor film in a channel formation region;
        a pixel electrode electrically connected to one of a source electrode and a drain electrode of the transistor;
        an insulating layer in contact with the pixel electrode; and
        a first common electrode in contact with the insulating layer,
    a second substrate facing the first substrate, the second substrate comprising a second common electrode; and
    a liquid crystal layer between the first substrate and the second substrate,
    wherein a potential difference between the first common electrode and the second common electrode is smaller than a potential difference between the second common electrode and the pixel electrode,
    wherein the potential difference between the second common electrode and the pixel electrode is smaller than a potential difference between the first common electrode and the pixel electrode,
    wherein the liquid crystal layer comprises a liquid crystal material with negative dielectric anisotropy, and wherein a specific resistivity of the liquid crystal material with negative dielectric anisotropy is greater than or equal to $1.8 \times 10^{13}$ Ω·cm and less than or equal to $1.0 \times 10^{16}$ Ω·cm.

7. The liquid crystal display device according to claim 6, wherein the crystalline oxide semiconductor film comprises In, Ga, and Zn.

8. The liquid crystal display device according to claim 6, wherein a dielectric constant anisotropy of the liquid crystal material with negative dielectric anisotropy is 3.0.

9. The liquid crystal display device according to claim 6, further comprising a planarization film between the first substrate and the pixel electrode.

10. The liquid crystal display device according to claim 6, further comprising a color film between the second substrate and the second common electrode.

11. The liquid crystal display device according to claim 6, wherein the first common electrode and the second common electrode are connected to different power supply lines.

12. The liquid crystal display device according to claim 6, wherein c-axes of the crystalline oxide semiconductor film are aligned in a direction perpendicular to a top surface of the crystalline oxide semiconductor film.

13. A liquid crystal display device comprising:
a first substrate comprising:
  a transistor comprising:
    a gate electrode over the first substrate;
    a gate insulating film over the gate electrode;
    a crystalline oxide semiconductor film over the gate insulating film; and
  a source electrode and a drain electrode over the crystalline oxide semiconductor film,
  a first common electrode over and in direct contact with the gate insulating film;
  an insulating layer over the first common electrode; and
  a pixel electrode over the insulating layer, the pixel electrode electrically connected to one of the source electrode and the drain electrode,
a second substrate facing the first substrate, the second substrate comprising a second common electrode; and
a liquid crystal layer between the first substrate and the second substrate,
wherein the first common electrode and the second common electrode are connected to different power supply lines,
wherein a potential difference between the first common electrode and the second common electrode is smaller than a potential difference between the second common electrode and the pixel electrode,
wherein the potential difference between the second common electrode and the pixel electrode is smaller than a potential difference between the first common electrode and the pixel electrode,
wherein the liquid crystal layer comprises a liquid crystal material with negative dielectric anisotropy, and
wherein a specific resistivity of the liquid crystal material with negative dielectric anisotropy is greater than or equal to $1.8 \times 10^{13}$ Ω·cm and less than or equal to $1.0 \times 10^{16}$ Ω·cm.

14. The liquid crystal display device according to claim 13, wherein the crystalline oxide semiconductor film comprises In, Ga, and Zn.

15. The liquid crystal display device according to claim 13, wherein a dielectric constant anisotropy of the liquid crystal material with negative dielectric anisotropy is −3.0.

16. The liquid crystal display device according to claim 13, further comprising a planarization film between the first substrate and the pixel electrode.

17. The liquid crystal display device according to claim 13, further comprising a color film between the second substrate and the second common electrode.

18. The liquid crystal display device according to claim 13, wherein c-axes of the crystalline oxide semiconductor film are aligned in a direction perpendicular to a top surface of the crystalline oxide semiconductor film.

* * * * *